United States Patent
Kwak et al.

(10) Patent No.: US 9,171,946 B2
(45) Date of Patent: Oct. 27, 2015

(54) NITRIDE SEMICONDUCTOR DEVICE AND METHOD OF MANUFACTURING THE SAME

(71) Applicant: Seoul Semiconductor Co., Ltd., Ansan-si (KR)

(72) Inventors: June Sik Kwak, Ansan-si (KR); Young Do Jong, Ansan-si (KR); Ho Young Cha, Seoul (KR); Bong Ryeol Park, Goyang-si (KR); Jae Gil Lee, Daejeon (KR); Kwan Hyun Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 16 days.

(21) Appl. No.: 14/198,011

(22) Filed: Mar. 5, 2014

(65) Prior Publication Data
US 2014/0252370 A1 Sep. 11, 2014

(30) Foreign Application Priority Data

Mar. 5, 2013 (KR) .......... 10-2013-0023429
Mar. 27, 2013 (KR) .......... 10-2013-0032632

(51) Int. Cl.
| | |
|---|---|
| H01L 29/15 | (2006.01) |
| H01L 29/778 | (2006.01) |
| H01L 29/66 | (2006.01) |
| H01L 29/417 | (2006.01) |
| H01L 29/06 | (2006.01) |
| H01L 29/423 | (2006.01) |
| H01L 29/10 | (2006.01) |

(52) U.S. Cl.
CPC .......... *H01L 29/778* (2013.01); *H01L 29/0619* (2013.01); *H01L 29/41766* (2013.01); *H01L 29/66431* (2013.01); *H01L 29/66462* (2013.01); *H01L 29/7786* (2013.01); *H01L 29/1066* (2013.01); *H01L 29/4236* (2013.01); *H01L 29/42316* (2013.01)

(58) Field of Classification Search
CPC .............. H01L 29/402; H01L 29/2003; H01L 29/66431; H01L 29/66462; H01L 29/7781; H01L 29/7786
USPC .................... 438/172; 257/76, 194, E29.089, 257/E21.403
See application file for complete search history.

(56) References Cited

U.S. PATENT DOCUMENTS

| | | | |
|---|---|---|---|
| 2013/0161638 A1* | 6/2013 | Yao et al. | 257/76 |
| 2014/0001478 A1* | 1/2014 | Saunier et al. | 257/76 |

* cited by examiner

*Primary Examiner* — Brooke Kebede
(74) *Attorney, Agent, or Firm* — H.C. Park & Associates, PLC

(57) ABSTRACT

Exemplary embodiments of the present invention disclose a unidirectional heterojunction transistor including a channel layer made of a first nitride-based semiconductor having a first energy bandgap, a barrier layer made of a second nitride-based semiconductor having a second energy bandgap different from the first energy bandgap, the barrier layer including a recess, a drain electrode disposed on a first region of the barrier layer, and a recessed-drain Schottky electrode disposed in the recess of the barrier layer, the recessed-drain Schottky electrode contacting the drain electrode.

24 Claims, 18 Drawing Sheets

NITRIDE SEMICONDUCTOR DEVICE AND METHOD OF MANUFACTURING THE SAME

CROSS-REFERENCE TO RELATED APPLICATIONS

This application claims priority from and the benefit of Korean Patent Application Nos. 10-2013-0023429 and 10-2013-0032632, filed on Mar. 5, 2013, and Mar. 27, 2013, respectively, which are hereby incorporated by reference for all purposes as if fully set forth herein.

BACKGROUND

1. Field

Exemplary embodiments of the present disclosure describe an article comprising a unidirectional heterojunction transistor, that is, a nitride semiconductor device, and a method of manufacturing the same, and more particularly, a unidirectional heterojunction transistor and a method of manufacturing the same, which can prevent a reverse leakage current using a rectification electrode.

Exemplary embodiments of the present disclosure also describe an article comprising a nitride semiconductor device including a mixed junction drain using Schottky contact and ohmic contact and a method of manufacturing the same.

2. Discussion of the Background

With the recent development of information communication technology, there may be a need for a transistor having a high-speed switching operation which is suitable for ultra high-speed and high-capacity signal transmission and a high voltage-resistant transistor suitable for a high-voltage environment, such as a hybrid vehicle, in various fields. However, conventional silicon-based transistors or GaAs-based transistors may have difficulties in complying with the need due to the limit of the materials themselves.

In contrast, a nitride-based transistor, in particular, a GaN-based may be suitable for ultra high-speed signal processing because it enables a high-speed switching operation as compared with a conventional silicon transistor, and it may be suitable for a high-voltage environment due to a high voltage-resistant characteristic of the materials themselves.

A nitride-based transistor, for example, a High Electron Mobility Transistor (HEMT) or a Heterostructure FET (HFET) using a heterojunction structure may be suitable for high-speed signal transmission due to high electron mobility because an electric current flows using Two-Dimensional Electron Gas (2DEG) generated at the interface between heterogeneous materials.

In a common GaN-based transistor, current flows in both directions by bringing a source electrode and a drain electrode into ohmic contact with each other. That is, current flows in both directions, that is, from the source electrode to the drain electrode and from the drain electrode to the source electrode.

In conventional application circuits that require a unidirectional electrification characteristic, in order to prevent current from flowing in a reverse direction, an additional diode may be combined with the drain electrode. Furthermore, in a conventional GaN-based transistor, current may be made to flow in one direction by combining Schottky contact diode with the drain electrode instead of an additional diode.

An example of a conventional nitride-based semiconductor device using a Schottky electrode is disclosed in Korean Patent Application Publication No. 10-2012-0064180, as shown in FIG. 1. In the disclosed nitride-based semiconductor device, in order to obtain a unidirectional electrification characteristic, a source electrode 133 is formed through ohmic contact with a barrier layer 124, and a gate electrode and a drain electrode 134 are formed through a Schottky contact with a Schottky electrode 136 or the drain electrode 134 is formed on the barrier layer 124 by mixing Schottky contact and ohmic contact. In the conventional nitride-based semiconductor device having such a structure, a forward current from the drain electrode 134 to the source electrode 133 is electrified, and a reverse current from the source electrode 133 to the drain electrode 134 is blocked.

If the drain electrode is used as Schottky contact, however, the conventional nitride-based semiconductor device may have a problem in that a threshold voltage generated due to a Schottky barrier becomes the threshold voltage of a forward state of a transistor irrespective of control of a gate threshold voltage.

Furthermore, in the conventional nitride-based semiconductor device, the threshold voltage may remain in the forward direction because the drain electrode is used by mixing Schottky contact and ohmic contact, but the prevention of a reverse leakage current may be limited because the reverse leakage current is generated through a drain region that is subject to ohmic contact in Two-dimensional Electron Gas (2DEG) that is formed by the junction of a channel layer and the barrier layer.

SUMMARY OF THE INVENTION

Exemplary embodiments of the present invention provide a nitride semiconductor device, that is, a unidirectional heterojunction transistor capable of effectively controlling a reverse leakage current using a recessed-drain Schottky electrode having a new structure in which a Schottky electrode and a drain electrode are brought in contact with each other, and a method of manufacturing the same.

Exemplary embodiments of the present invention also provide a nitride semiconductor device, that is, a unidirectional heterojunction transistor capable of preventing a reverse leakage current and also improving switching efficiency and power efficiency by lowering a forward threshold voltage through a recessed-drain Schottky electrode having a new structure, and a method of manufacturing the same.

Exemplary embodiments of the present invention also provide a nitride semiconductor device and a method of manufacturing the same, which are capable of improving reliability of a reverse current blocking characteristic between a source electrode and a drain electrode in a semiconductor device using a nitride semiconductor and increasing mass production by reducing a deviation in a manufacturing process.

Exemplary embodiments of the present invention also provide a nitride semiconductor device and a method of manufacturing the same which are capable of ensuring a normally-off characteristic and a reverse current blocking characteristic in high reliability and mass production capability in a semiconductor device using a nitride semiconductor.

Additional features of the invention will be set forth in the description which follows, and in part will be apparent from the description, or may be learned by practice of the invention.

An exemplary embodiment of the present invention discloses a nitride semiconductor device, that is, a unidirectional heterojunction transistor, which includes a channel layer made of a first nitride-based semiconductor having a first energy bandgap, a barrier layer made of a second nitride-based semiconductor having a second energy bandgap different from the first energy bandgap, a recess region formed in the barrier layer, a drain electrode disposed over the barrier layer on one side of the barrier layer, and a recessed-drain Schottky electrode disposed in the recess and brought in contact with the drain electrode.

The nitride semiconductor device in accordance with an exemplary embodiment of the present invention may further include a source electrode disposed over the barrier layer on the other side of the barrier layer and a gate electrode disposed between the source electrode and the recessed-drain Schottky electrode.

In the nitride semiconductor device in accordance with an exemplary embodiment of the present invention, the recessed-drain Schottky electrode may be made of the same materials as the gate electrode, and configured to have a structure that cover one side and a top surface of the drain electrode.

In the nitride semiconductor device in accordance with an exemplary embodiment of the present invention, the recessed-drain Schottky electrode blocks 2DEG, formed at the interface of the channel layer and the barrier layer, from flowing from the source electrode to the drain electrode.

In the nitride semiconductor device in accordance with an exemplary embodiment of the present invention, the recessed-drain Schottky electrode permits a unidirectional current flow from the drain electrode to the source electrode and forms a Schottky potential barrier for blocking an electric current from flowing from the source electrode to the drain electrode between the source electrode and the drain electrode.

In the nitride semiconductor device in accordance with an exemplary embodiment of the present invention, the recessed-drain Schottky electrode may include one end part inserted into the recess region of a trench form that extends in the direction in which the drain electrode extends.

In the nitride semiconductor device in accordance with an exemplary embodiment of the present invention, the one end part may be divided in plural numbers and formed in the direction in which the drain electrode extends.

In the nitride semiconductor device in accordance with an exemplary embodiment of the present invention, the recessed-drain Schottky electrode may be made of materials using one of Ni, Pd, Au, Pt, W, Al, and mixed metal of them as a main component.

In the nitride semiconductor device in accordance with an exemplary embodiment of the present invention, the barrier layer may be made of materials that form a 2DEG induction channel at the interface of the barrier layer and the channel layer.

In the nitride semiconductor device in accordance with an exemplary embodiment of the present invention, the channel layer and the barrier layer may have a structure in which a plurality of GaN semiconductor layers that form at least one channel layer and at least one barrier layer are brought in contact with each other.

In accordance with an exemplary embodiment of the present invention, a method of manufacturing a nitride semiconductor device includes a first step of forming a channel layer made of a first nitride-based semiconductor having a first energy bandgap and a barrier layer made of a second nitride-based semiconductor having a second energy bandgap different from the first energy bandgap, a second step of forming a source electrode and a drain electrode over the barrier layer, a third step of forming a recess region configured to be adjacent to the drain electrode and formed in the barrier layer, and a fourth step of forming a recessed-drain Schottky electrode in the recess region.

In the method of manufacturing a nitride semiconductor device in accordance with an exemplary embodiment of the present invention, the third step includes forming the interval between the recess region and the channel layer within a range of about 1 nm to 5 nm.

In the method of manufacturing a nitride semiconductor device in accordance with an exemplary embodiment of the present invention, the fourth step includes forming the recessed-drain Schottky electrode having one end part placed in the recess region of a trench form that extends in the direction in which the drain electrode extends.

The method of manufacturing a nitride semiconductor device in accordance with an exemplary embodiment of the present invention further includes a fifth step of forming a gate electrode on the barrier layer.

In the method of manufacturing a nitride semiconductor device in accordance with an exemplary embodiment of the present invention, the fourth step and the fifth step are performed at the same time.

In the method of manufacturing a nitride semiconductor device in accordance with an exemplary embodiment of the present invention, the fourth step includes forming the recessed-drain Schottky electrode and the gate electrode using materials having one of Ni, Pd, Au, Pt, W, Al, and mixed metal of them as a main component.

In the method of manufacturing a nitride semiconductor device in accordance with an exemplary embodiment of the present invention, the first step may include forming the barrier layer using materials that form a 2DEG induction channel at the interface of the barrier and the channel layer.

In the method of manufacturing a nitride semiconductor device in accordance with an exemplary embodiment of the present invention, the first step may include forming the channel layer and the barrier layer having a structure in which a plurality of GaN-based semiconductor material layers that form at least one channel layer and at least one barrier layer is brought in contact with each other.

In accordance with an exemplary embodiment of the present invention, a method of manufacturing a nitride semiconductor device includes a first step of forming a first nitride semiconductor layer having a first energy bandgap, a second step of forming a second nitride semiconductor layer having a second energy bandgap over the first nitride semiconductor layer, a third step of forming an insulating film of a predetermined pattern having a first recess pattern layer for forming a first trench over the second nitride semiconductor layer, a fourth step of forming a regrowth third nitride semiconductor layer over the second nitride semiconductor layer having a thickness equal to or lower than a thickness of the insulating film, a fifth step of forming a source electrode and a drain electrode over the third nitride semiconductor layer, a sixth step of removing the insulating film, and a seventh step of forming a gate electrode in a gate region over the second nitride semiconductor layer and forming a recessed-drain Schottky electrode so that the recessed-drain Schottky electrode comes in contact with the drain electrode and comes in contact with the second nitride semiconductor layer exposed to a bottom of the first trench.

In the method of manufacturing a nitride semiconductor device in accordance with an exemplary embodiment of the present invention, the second step may include forming the second nitride semiconductor layer in the thickness in which a 2DEG channel is not formed by the junction of the first nitride semiconductor layer and the second nitride semiconductor layer in the state in which a bias has not been applied to the gate electrode, and the fourth step may include forming the third nitride semiconductor layer in the thickness in which the 2DEG channel is formed by the junction of the first nitride semiconductor layer, the second nitride semiconductor layer, and the third nitride semiconductor layer in the state in which a bias not has been applied to the gate electrode.

In the method of manufacturing a nitride semiconductor device in accordance with an exemplary embodiment of the present invention, the second step may include forming the second nitride semiconductor layer having the second energy bandgap greater than the first energy bandgap, and the fourth step may include forming the third nitride semiconductor layer having the third energy bandgap greater than the first energy bandgap.

In the method of manufacturing a nitride semiconductor device in accordance with an exemplary embodiment of the present invention, the fourth step may include forming the third nitride semiconductor layer having a thicker thickness than the second nitride semiconductor layer, and the third nitride semiconductor layer may include a third energy bandgap equal to the second energy bandgap.

In the method of manufacturing a nitride semiconductor device in accordance with an exemplary embodiment of the present invention, the fourth step may include forming the third nitride semiconductor layer having a third energy bandgap greater than the second energy bandgap.

In the method of manufacturing a nitride semiconductor device in accordance with an exemplary embodiment of the present invention, the first nitride semiconductor layer may be made of GaN, and the second nitride semiconductor layer and the third nitride semiconductor layer may be made of $Al_xGa_{1-x}N$. Here, the third nitride semiconductor layer has a greater aluminum (Al) composition ratio than the second nitride semiconductor layer.

In the method of manufacturing a nitride semiconductor device in accordance with an exemplary embodiment of the present invention, the second step may include forming the second nitride semiconductor layer having an Al composition ratio of 5% to 25% and having a thickness of 3 nm to 15 nm, the fourth step may include forming the third nitride semiconductor layer having an Al composition ratio of 15% to 100% and a thickness of 5 nm to 30 nm.

In the method of manufacturing a nitride semiconductor device in accordance with an exemplary embodiment of the present invention, the third step may include forming the insulating film having a second recess pattern layer for forming a second trench along with the first recess pattern layer.

In the method of manufacturing a nitride semiconductor device in accordance with an exemplary embodiment of the present invention, the seventh step may include forming the recess gate electrode in the second trench along with the recessed-drain Schottky electrode.

The method of manufacturing a nitride semiconductor device in accordance with an exemplary embodiment of the present invention may further include forming a P type semiconductor gate in the second trench by epitaxially growing the second nitride semiconductor layer before the fourth step. Here, the seventh step may include forming a recess gate electrode in a second trench region along with the recessed-drain Schottky electrode using the insulating film as a mask.

In the method of manufacturing a nitride semiconductor device in accordance with an exemplary embodiment of the present invention, the seventh step may include forming a gate electrode on the P type semiconductor gate when forming the recess gate electrode.

In the method of manufacturing a nitride semiconductor device in accordance with an exemplary embodiment of the present invention, the seventh step may include forming a gate insulating film on the P type semiconductor gate before forming the gate electrode.

In the method of manufacturing a nitride semiconductor device in accordance with an exemplary embodiment of the present invention, the seventh step may include forming the P type semiconductor gate using a GaN, AlGaN, or i-AlGaN semiconductor having a hole concentration of $5\times10^{16}/cm^3$ to $5\times10^{18}/cm^3$ and a thickness of 10 nm to 80 nm through the implantation of impurities.

The method of manufacturing a nitride semiconductor device in accordance with another aspect of the present invention may further include forming a passivation layer that covers the second nitride semiconductor layer exposed between the source electrode, the gate electrode, and the recessed-drain Schottky electrode.

In accordance with an exemplary embodiment of the present invention, a nitride semiconductor device includes a first nitride semiconductor layer configured to have a first energy bandgap, a second nitride semiconductor layer disposed over the first nitride semiconductor layer and configured to have a second energy bandgap different from the first energy bandgap, a third nitride semiconductor layer disposed over the second nitride semiconductor layer and configured to comprise a first trench, a source electrode and a drain electrode disposed over the third nitride semiconductor layer, a gate electrode formed over the second nitride semiconductor layer and disposed between the source electrode and the gate electrode, and a recessed-drain Schottky electrode configured to come in contact with the second nitride semiconductor layer exposed to the bottom of the first trench and formed over the second nitride semiconductor layer and the third nitride semiconductor layer in such a way as to come in contact with the drain electrode.

In the nitride semiconductor device in accordance with an exemplary embodiment of the present invention, the second nitride semiconductor layer may be formed at the thickness in which a 2DEG channel is not formed by the junction of the first nitride semiconductor layer and the second nitride semiconductor layer in the state in which a bias has not been applied to the gate electrode, and the third nitride semiconductor layer is formed at the thickness in which the 2DEG channel is formed by the junction of the first nitride semiconductor layer, the second nitride semiconductor layer, and the third nitride semiconductor layer in the state in which a bias not has been applied to the gate electrode.

In the nitride semiconductor device in accordance with an exemplary embodiment of the present invention, the second nitride semiconductor layer may have the second energy bandgap greater than the first energy bandgap, and the third nitride semiconductor layer may have the third energy bandgap greater than the first energy bandgap.

In the nitride semiconductor device in accordance with an exemplary embodiment of the present invention, the third nitride semiconductor layer may have the third energy bandgap equal to the second energy bandgap, and the third nitride semiconductor layer may have a thicker thickness than the second nitride semiconductor layer.

In the nitride semiconductor device in accordance with an exemplary embodiment of the present invention, the third nitride semiconductor layer may have the third energy bandgap greater than the second energy bandgap.

In the nitride semiconductor device in accordance with an exemplary embodiment of the present invention, the first nitride semiconductor layer may be made of GaN, and the second nitride semiconductor layer and the third nitride semiconductor layer may be made of $Al_xGa_{1-x}N$. Here, the third nitride semiconductor layer has a greater aluminum (Al) composition ratio than the second nitride semiconductor layer.

In the nitride semiconductor device in accordance with an exemplary embodiment of the present invention, the second nitride semiconductor layer may have an Al composition ratio of 5% to 25% and a thickness of 3 nm to 15 nm, and the third nitride semiconductor layer may have an Al composition ratio of 15% to 100% and a thickness of 5 nm to 30 nm.

In the nitride semiconductor device in accordance with an exemplary embodiment of the present invention, the gate electrode may include a recess gate electrode extended into the second nitride semiconductor layer in a specific length through a second trench provided in the third nitride semiconductor layer.

In the nitride semiconductor device in accordance with an exemplary embodiment of the present invention, the recess gate electrode may include a P type semiconductor gate inserted into the second trench and brought in contact with the second nitride semiconductor layer and a gate electrode disposed over the P type semiconductor gate.

In the nitride semiconductor device in accordance with an exemplary embodiment of the present invention, the recess gate electrode may include a gate insulating film or an insulating masking layer disposed between the P type semiconductor gate and the gate electrode.

In the nitride semiconductor device in accordance with an exemplary embodiment of the present invention, the P type semiconductor gate is made of a GaN, AlGaN, or i-AlGaN semiconductor having a hole concentration of $5 \times 10^{16}/cm^3$ to $5 \times 10^{18}/cm^3$ and a thickness of 10 nm to 80 nm using impurities.

The nitride semiconductor device in accordance with an exemplary embodiment of the present invention may further include a passivation layer that covers the second nitride semiconductor layer exposed between the source electrode, the gate electrode, and the recessed-drain Schottky electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
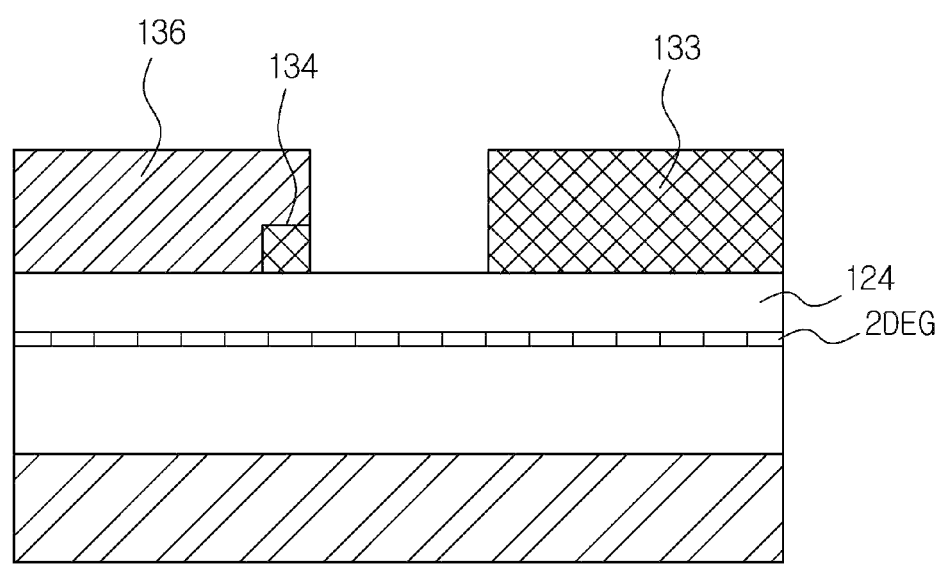
FIG. 1 is a cross-sectional view of a conventional nitride-based semiconductor device.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly In the following exemplary embodiments, unidirectional heterojunction transistors made of a gallium nitride (GaN)-based semiconductor have been illustrated, but the present invention is not limited to the unidirectional heterojunction transistors and the unidirectional heterojunction transistors may be implemented using various types of nitride-based semiconductors.

Furthermore, the following exemplary embodiments are not intended to limit the scope of the present invention, but are intended to illustrate elements proposed in the claims of the present invention. An exemplary embodiment including an element that is included in the technical spirit written in the specification of the present invention and that may be substituted as an equivalent matter in the elements of the claims may be included in the scope of the present invention.

Figure 2:
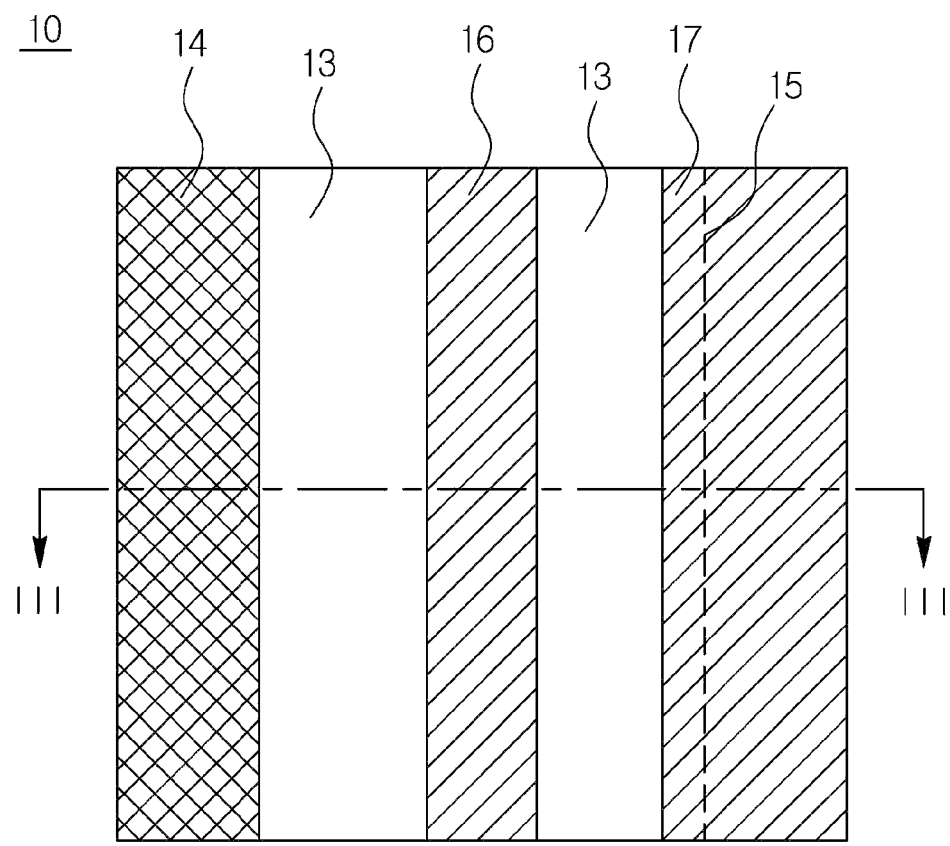
FIG. 2 is a plan view of a unidirectional heterojunction transistor according to an exemplary embodiment of the present invention.
Figure 3:
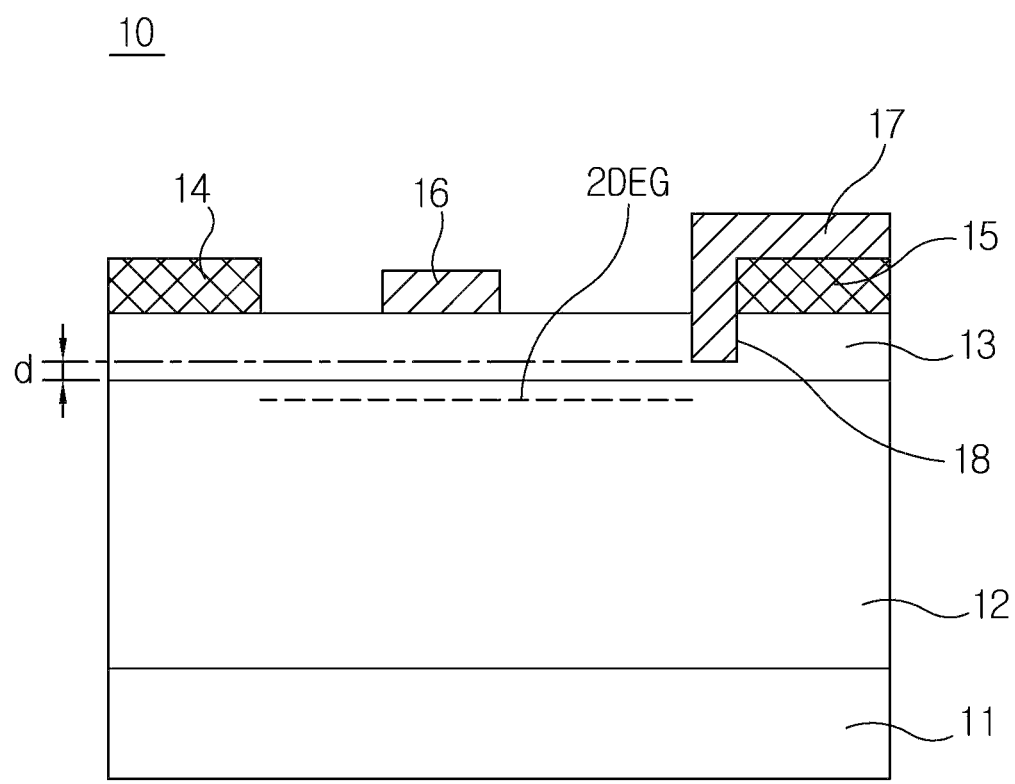
FIG. 3 is a cross-sectional view of the unidirectional heterojunction transistor taken along line III-III of FIG. 2.

FIG. 2 is a plan view of a unidirectional heterojunction transistor according to an exemplary embodiment of the present invention, and FIG. 3 is a cross-sectional view of the unidirectional heterojunction transistor taken along line III-III of FIG. 2.

Referring to FIGS. 2 and 3, the unidirectional heterojunction transistor 10 includes a substrate 11, a channel layer 12, a barrier layer 13, a source electrode 14, a drain electrode 15, a gate electrode 16, and a recessed-drain Schottky electrode 17.

The substrate 11 may be a growth substrate, such as a sapphire substrate, an AlN substrate, a GaN substrate, a SiC substrate, or a Si substrate, but is not specially limited to any substrate if a nitride-based semiconductor can be grown on the substrate.

A buffer layer (not shown) may be provided on the substrate 11. The buffer layer can play a role of a core so that the channel layer 12 is grown on the substrate 11 and may function to reduce a lattice constant mismatch between the substrate 11 and the channel layer 12.

The channel layer 12 is formed on the substrate 11 and made of a first nitride-based semiconductor having a first energy bandgap. The first nitride-based semiconductor is not specially limited and may be made of, for example, a binary system nitride semiconductor, such as undoped GaN or InN, a ternary system nitride semiconductor, such as AlGaN or InGaN, or a quaternary system nitride semiconductor, such as AlInGaN. Furthermore, the channel layer 12 may be doped with n type impurities (i.e., donors) or p type impurities (i.e., accepters).

The barrier layer 13 is formed on the channel layer 12 and is made of a second nitride-based semiconductor having a second energy bandgap. The second energy bandgap refers to an energy bandgap different from the first energy bandgap. The second nitride-based semiconductor is not specially limited and may be made of, for example, a binary system nitride semiconductor, such as undoped GaN or InN, a ternary system nitride semiconductor, such as AlGaN or InGaN, or a quaternary system nitride semiconductor, such as AlInGaN. Furthermore, the barrier layer 13 may be doped with n type or p type impurities.

Furthermore, the second nitride-based semiconductor may have a greater energy bandgap than the first nitride-based semiconductor that forms the channel layer 12. For example, the first nitride-based semiconductor may be undoped GaN, and the second nitride-based semiconductor may be AlGaN. In the present exemplary embodiment, the second nitride-based semiconductor has been illustrated as having a greater energy bandgap than the first nitride-based semiconductor, but the present invention is not limited thereto. The energy bandgap of the second nitride-based semiconductor may be smaller than that of the first nitride-based semiconductor if the second nitride-based semiconductor is made of materials capable of forming a 2DEG induction channel at the interface of the channel layer 12 and the barrier layer 13 through a heterojunction. The channel layer 12 and the barrier layer 13 made of the first and the second nitride-based semiconductor as described above may be formed by stacking a plurality of GaN semiconductor layers in which at least one channel layer and at least one barrier layer are formed.

If a heterojunction structure made of AlGaN/GaN is used, high electron mobility, a high breakdown voltage, and a high output characteristic can be obtained using a 2DEG induction channel in a potential well that is generated due to a discontinuity between the conduction bands of the two materials, that is, AlGaN and GaN.

Referring to FIGS. 2 and 3, the source electrode 14 and the drain electrode 15 are disposed on the barrier layer 13 and are brought in ohmic contact with the barrier layer 13. The source electrode 14 and the drain electrode 15 may be made of materials, such as titanium (Ti), aluminum (Al), or gold (Au) capable of ohmic contact with the barrier layer 13.

The gate electrode 16 is disposed between the source electrode 14 and the drain electrode 15. The gate electrode 16 may be made of materials (e.g., mixed metal), such as Ni/Au capable of Schottky contact with the barrier layer 13.

The gate electrode 16 may be formed on the barrier layer 13 so that a device operates as a normally-on device or a recess structure may be formed under the gate electrode 16 so that a device operates as a normally-off device. If the gate electrode 16 is implemented so that a device operates as a normally-off device, a discontinuous region of a 2DEG induction channel may be formed under the gate electrode 16. Accordingly, the gate electrode 16 can operate so that a drain-source current can flow only at a positive gate voltage. In the exemplary embodiments of the present invention described herein, a normally-on device is chiefly described.

The recessed-drain Schottky electrode 17 is disposed between the gate electrode 16 and the drain electrode 15. The recessed-drain Schottky electrode 17 is formed in such a way as to be brought in contact with the drain electrode 15 and placed in a recess region 18 formed in the barrier layer 13. The recessed-drain Schottky electrode 17 is formed in such a way as to cover the bottom surface and inside surface of the recess region 18 and to cover one side and top surface of the drain electrode 15.

The thickness 'd' of the barrier layer 13 formed between a top surface of the channel layer 12 and a bottom surface of the recess region may be about 1 nm to about 5 nm. In such a case, if the thickness 'd' of the barrier layer 13 is less than about 1 nm, a channel may be depleted, and a forward threshold voltage of the heterojunction transistor may be high. If the thickness 'd' of the barrier layer 13 exceeds about 5 nm, the depletion region may not be sufficiently formed by a Schottky barrier and thus the discontinuous region may not be properly formed in the 2DEG channel.

In accordance with the recessed-drain Schottky electrode 17 having the aforementioned structure, a leakage current from the source electrode 14 to the drain electrode 15 can be blocked by forming the discontinuous region in the 2DEG induction channel under the recess region 18. Here, the leakage current refers to an electric current that flows through a drain electrode that has been brought in ohmic contact with a barrier layer through when a reverse voltage is applied between a source electrode and the drain electrode in an existing heterojunction transistor.

As described above, the recess region 18 is formed on the lower side of the drain electrode 15 brought in ohmic contact with the barrier layer 13 near the drain electrode 15, and the recessed-drain Schottky electrode 17 that fill the recess region 18 is formed. Accordingly, a reverse leakage current can be prevented and a threshold voltage in the forward state can be lowered as compared with an existing heterojunction transistor using a Schottky contact drain electrode. That is, the unidirectional heterojunction transistor 10 according to the present exemplary embodiment can reduce a threshold voltage to almost 0 V and also prevent a reverse leakage current from occurring.

In accordance with the present exemplary embodiment, the unidirectional heterojunction transistor 10 permits a current flow from the drain electrode 15 to the source electrode 14, but blocks a current flow from the source electrode 14 to the drain electrode 15 using the recessed-drain Schottky electrode that makes an electric current flow in one direction. Accordingly, the occurrence of a reverse leakage current can be prevented.

Figure 4:
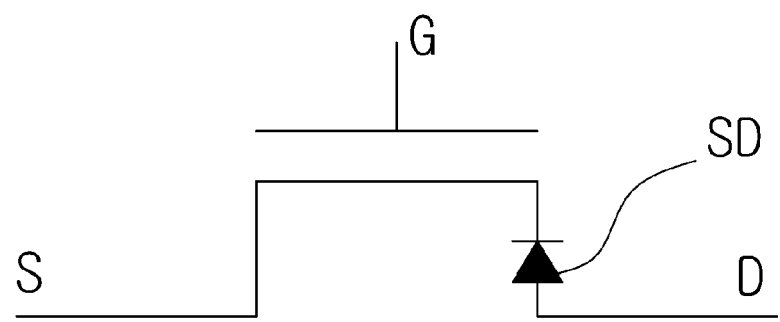
FIG. 4 is a diagram showing the equivalent circuit of the unidirectional heterojunction transistor according to an exemplary embodiment of the present invention.

FIG. 4 is a diagram showing the equivalent circuit of the unidirectional heterojunction transistor according to an exemplary embodiment of the present invention.

Referring to FIG. 4, in the unidirectional heterojunction transistor according to the present exemplary embodiment, a diode capable of preventing a reverse leakage current from a source electrode S to a drain electrode D using a recessed-drain Schottky electrode SD combined with the drain electrode D corresponds to a heterojunction transistor.

Referring to FIGS. 3 and 4, the junction between the barrier layer 13 made of the second nitride-based semiconductor and the recessed-drain Schottky electrode 17 made of metallic materials forms a Schottky barrier due to a difference between the work functions of the second nitride-based semiconductor and the metallic materials, and the Schottky barrier shows a rectification characteristic.

If only an existing Schottky electrode is used, a rectification characteristic may be obtained, but a threshold voltage in the forward electrification state of a heterojunction transistor may be increased due to a high Schottky barrier. Furthermore, the Schottky electrode combined with an ohmic electrode (a drain electrode, a source electrode, etc.) can reduce a threshold voltage of an on state, but shows a high leakage current through the ohmic electrode close to a 2DEG channel region.

Thus, according to exemplary embodiments of the present invention, the recessed-drain Schottky electrode 17 is formed by combining the recessed-drain Schottky electrode 17 with the drain electrode 15 having an ohmic characteristic and the discontinuous region is formed under the 2DEG induction channel placed under the recessed-drain Schottky electrode 17, thereby blocking a reverse leakage current.

That is, in the case of a reverse voltage, an electric current is difficult to flow from the source electrode 14 to the recessed-drain Schottky electrode 17 and the drain electrode 15 due to the Schottky barrier. In the case of a forward voltage, an electric current can flow because both the drain electrode 15 and the recessed-drain Schottky electrode 17 are used.

As described above, the unidirectional heterojunction transistor 10 of the present exemplary embodiment having the structure in which the recessed-drain Schottky electrode 17 is combined with the drain electrode 15 having an ohmic characteristic can have a low forward threshold voltage in a unidirectional switching characteristic and a low leakage current characteristic although a reverse voltage is applied.

In accordance with the present exemplary embodiment, a reverse leakage current in the heterojunction transistor can be prevented using the recessed-drain Schottky electrode 17, efficiency can be improved due to a reduced switching loss, and thus the unidirectional heterojunction transistor, which is useful in application products, such as a power switching element and a high-frequency element that require fast switching speed, can be provided.

FIGS. 5A to 5D are schematic process diagrams illustrating a method of manufacturing the unidirectional heterojunction transistor according to an exemplary embodiment of the present invention.

Figure 5A:
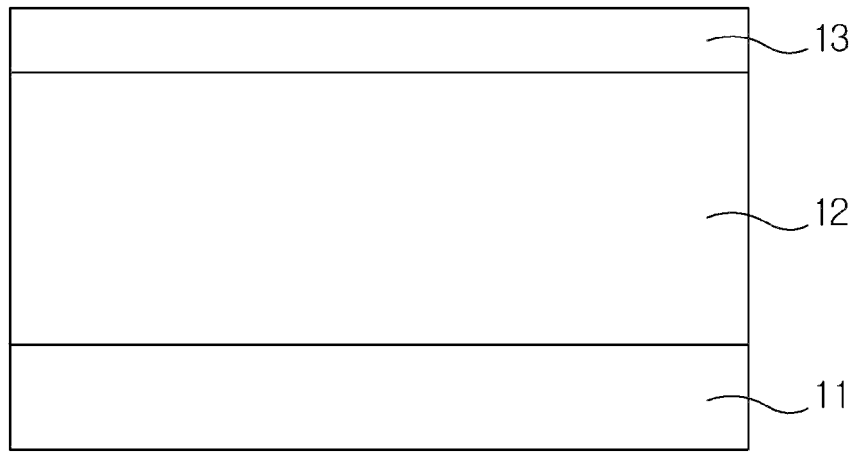
FIGS. 5A, 5B, 5C, and 5D are schematic process diagrams illustrating a method of manufacturing a unidirectional heterojunction transistor according to an exemplary embodiment of the present invention.

As shown in FIG. 5A, the channel layer 12 made of the first nitride-based semiconductor having the first energy bandgap is formed on the substrate 11. The barrier layer 13 made of the second nitride-based semiconductor having the second energy bandgap different from the first energy bandgap is formed on the channel layer 12.

The channel layer 12 and the barrier layer 13 may be sequentially formed and may have a structure in which a plurality of nitride-based semiconductor layers is stacked in three or more layers. The channel layer 12 and the barrier layer 13 may be grown using a film formation method, such as Metal Organic Chemical Vapor Deposition (MOCVD), Molecular Beam Epitaxy (MBE), or Hydride Vapor Phase Epitaxy (HVPE).

The first nitride-based semiconductor of the channel layer 12 and the second nitride-based semiconductor of the barrier layer 13 are selected from materials having different energy bandgaps so that they can form 2DEG through the junction of heterogeneous materials. If the second energy bandgap of the second nitride-based semiconductor is greater than the first energy bandgap of the first nitride-based semiconductor, 2DEG is formed near the interface of the two materials within the channel layer 12. If the second energy bandgap of the second nitride-based semiconductor is smaller than the first energy bandgap of the first nitride-based semiconductor, 2DEG is formed near the interface of the two materials within the barrier layer 13.

The first and the second nitride-based semiconductor are not specially limited and may be made of, for example, binary system nitride-based semiconductor materials, such as undoped GaN or InN, ternary system nitride-based semiconductor materials, such as AlGaN or InGaN, or quaternary system nitride-based semiconductor materials, such as AlInGaN. In the following description, undoped GaN has been illustrated as being used as the first nitride-based semiconductor and AlGaN has been illustrated as being used as the second nitride-based semiconductor, for convenience of description.

If an AlGaN/GaN heterojunction structure is used, high electron mobility, a high breakdown voltage, and an excellent high output characteristic in a heterojunction transistor can be obtained because a 2DEG channel that is generated due to the discontinuity of a large conduction band between the two materials can be used.

Figure 5B:
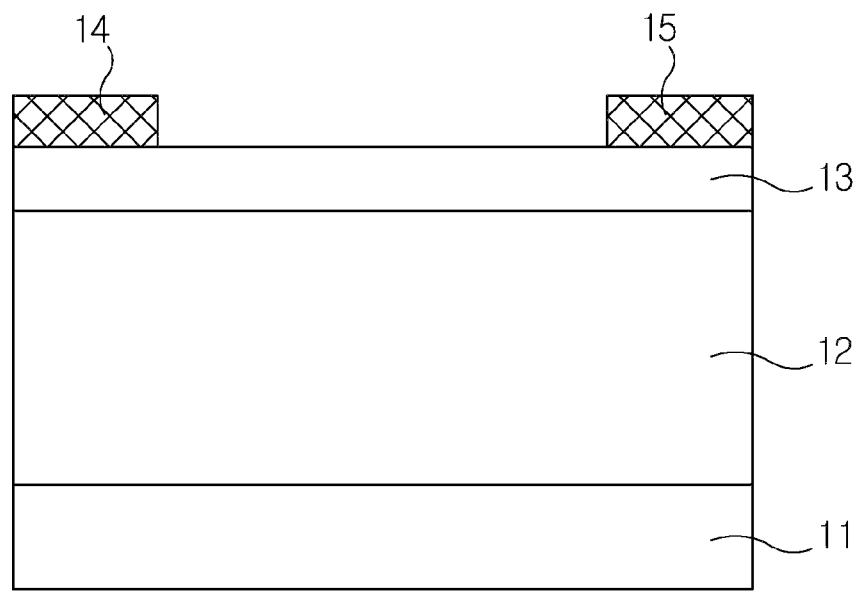

Next, as shown in FIG. 5B, the source electrode 14 and the drain electrode 15 that are brought in ohmic contact with the barrier layer are formed on the barrier layer 13. The source electrode 14 and the drain electrode 15 are disposed at a specific interval. The source electrode 14 and the drain electrode 15 may be made of materials capable of ohmic contact with the barrier layer 13, such as Ti/Al or Ti/Au.

Figure 5C:
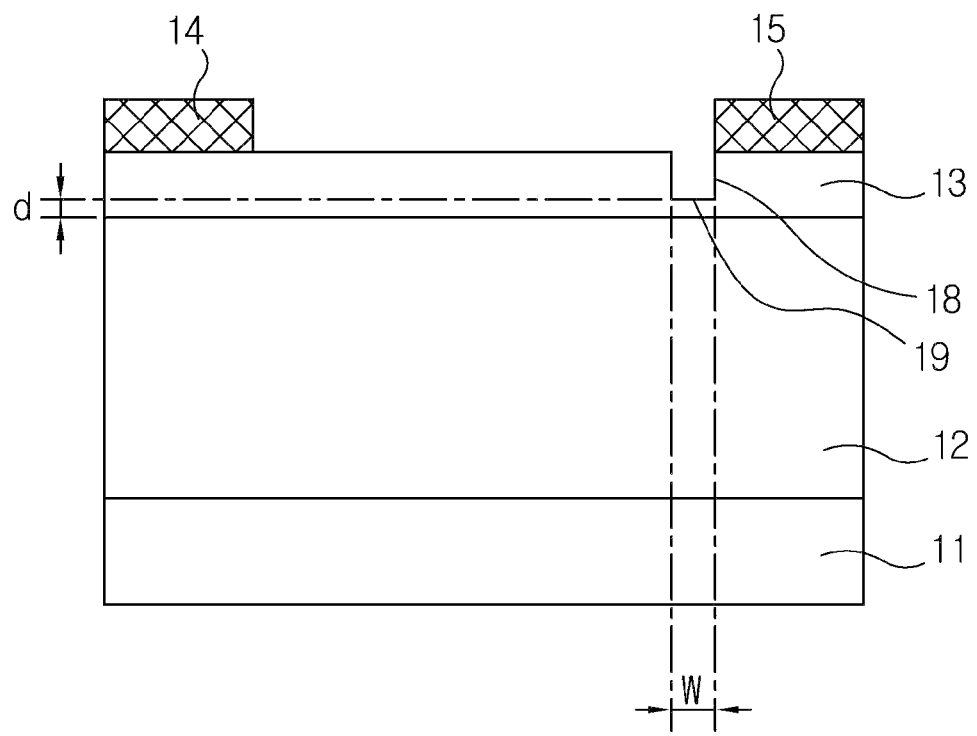

Next, as shown in FIG. 5C, the recess region 18 is formed in a part that neighbors the drain electrode 15 between the source electrode 14 and the drain electrode 15. The recess region 18 corresponds to a trench formed by etching the barrier layer 13. The recess region 18 may be formed in the form of a trench which includes a bottom surface and an inside surface by removing a specific region of the barrier layer 13 to a specific depth through a wet or dry etch process. The recess region 18 may be formed to a depth in which the 2DEG channel has not been formed within the barrier layer 13.

The threshold voltage and depletion region of the unidirectional heterojunction transistor can be controlled by controlling the width and depth of the recess region 18. That is, the size of a depletion region is controlled when a reverse bias is applied by controlling the width W of the recess region 18 (i.e., the width in the source-drain direction). Furthermore, the size of a threshold voltage of the heterojunction transistor can be controlled by controlling the depth of the recess region. As described above, in the present exemplary embodiment, the width, shape, depth, etc. of the recess region 18 are not specially limited because they can be randomly designed depending on the materials or structure of the heterojunction transistor.

In accordance with the present exemplary embodiment, the threshold voltage of the heterojunction transistor can be freely controlled by controlling the length, width, etc. of the recess region formed in the barrier layer when designing the heterojunction transistor, thereby being capable of improving the degree of design freedom of the heterojunction transistor for a threshold voltage characteristic.

Figure 5D:
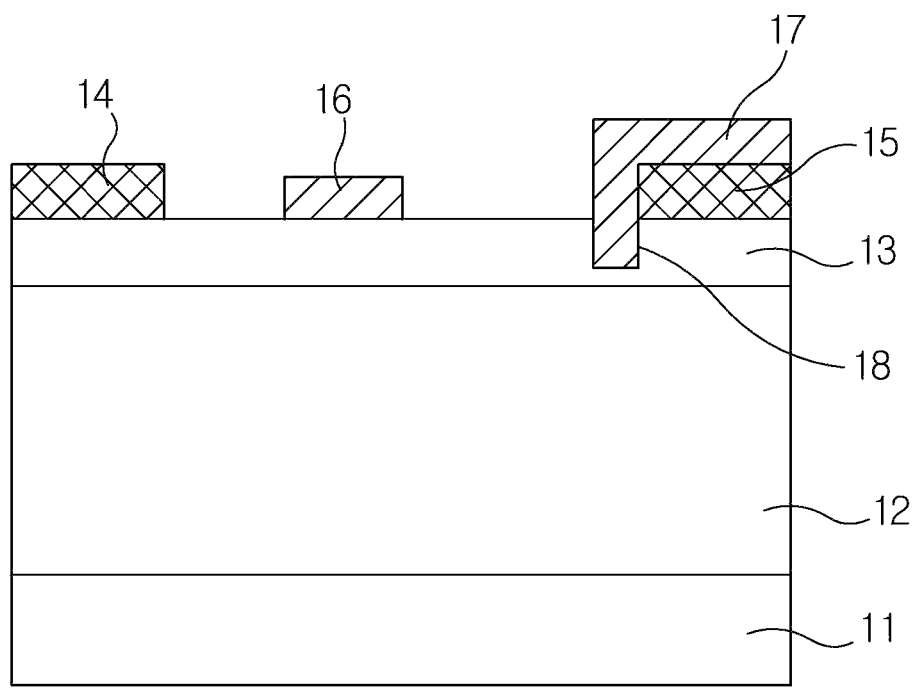

Next, as shown in FIG. 5D, the recessed-drain Schottky electrode 17 is formed in the recess region 18. The recessed-drain Schottky electrode 17 may be deposited on the recess region 18 and the drain electrode 15 using a Physical Vapor Deposition (PVD) or Chemical Vapor Deposition (CVD) method. Accordingly, the recessed-drain Schottky electrode 17 may be grown on the recess region 18 and the drain electrode 15 using a patterned oxide layer.

The recessed-drain Schottky electrode 17 is formed using electrode materials that come in Schottky contact with the barrier layer 13. A single metal such as Ni, Pd, Au, Pt, W, or Al, or mixed metal of Ni, Pd, Au, Pt, W, and Al may be used as the materials for Schottky contact. For example, Ni/Au, Pd/Au, Pt/W, or Ti/Au may be used as the mixed metal. Furthermore, metal materials, such as Ir or Mo, may be used as the materials for Schottky contact. Pt can have a high breakdown voltage and a low gate leakage current due to a high metal work function, and Mo can enable a stabilized operation at a high temperature due to a high melting point. As described above, the recessed-drain Schottky electrode 17 may be formed by a combination of the various types of materials.

The gate electrode 16 is formed between the source electrode 14 and the recessed-drain Schottky electrode 17. Since the recessed-drain Schottky electrode 17 is formed by the Schottky contact, the gate electrode 16 that comes in Schottky contact with the barrier layer 13 can be simultaneously formed in a process of forming the recessed-drain Schottky electrode 17. The gate electrode 16 may be made of materials (e.g., Ni/Au) capable of Schottky contact with the barrier layer 13.

As described above, the process of manufacturing the unidirectional heterojunction transistor according to the present exemplary embodiment can implement a heterojunction transistor having a unidirectional switching characteristic because the recessed-drain Schottky electrode 17 and the gate electrode 16 are formed at the same time without an additional process. Furthermore, since a mixed component electrode including the drain electrode 15 and the recessed-drain Schottky electrode 17 that come in ohmic contact with each other is used, a reverse leakage current can be prevented, a forward threshold voltage can be lowered, and thus the heterojunction transistor can have high switching efficiency.

Figure 6:
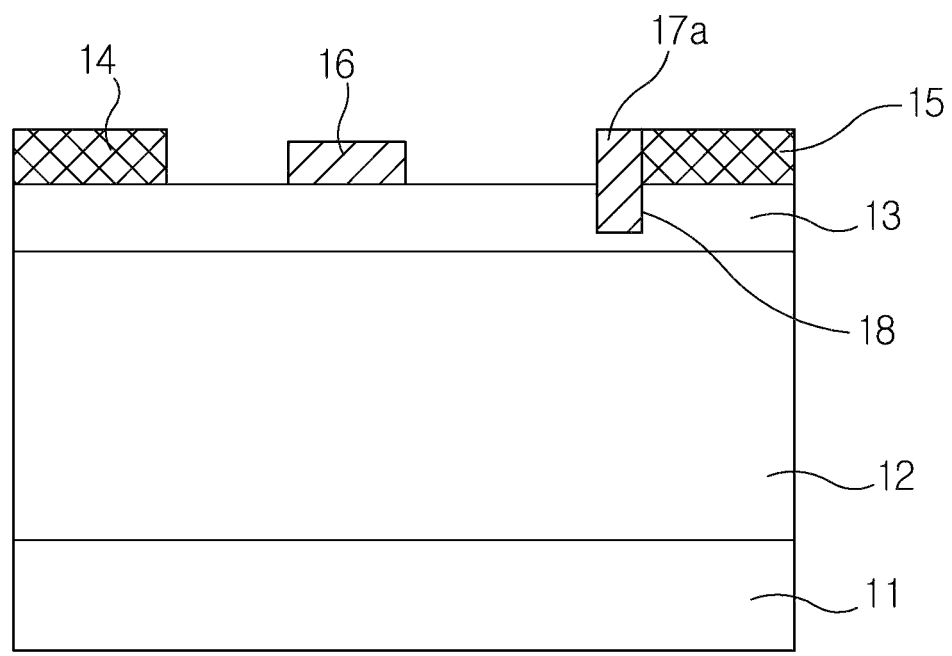
FIG. 6 is a cross-sectional view of a unidirectional heterojunction transistor in accordance with an exemplary embodiment of the present invention.

FIG. 6 is a cross-sectional view of a unidirectional heterojunction transistor in accordance with an exemplary embodiment of the present invention.

Referring to FIG. 6, the unidirectional heterojunction transistor 10A includes the substrate 11, the channel layer 12, the barrier layer 13, the source electrode 14, the drain electrode 15, the gate electrode 16, and a recessed-drain Schottky electrode 17a.

The unidirectional heterojunction transistor 10A according to the present exemplary embodiment is substantially the same as the unidirectional heterojunction transistor 10 described with reference to FIGS. 2 and 3 except the structure of the recessed-drain Schottky electrode 17a, and thus a detailed description of the same elements is omitted in order to avoid redundancy.

The recessed-drain Schottky electrode 17a is configured to come in contact with one side of the drain electrode 15 and is inserted into the recess region 18. The recessed-drain Schottky electrode 17a is substantially the same as the recessed-drain Schottky electrode 17 of FIGS. 2 and 3 except that resistance between the recessed-drain Schottky electrode 17a and the drain electrode 15 is slightly increased because a contact surface between the recessed-drain Schottky electrode 17a and the drain electrode 15 is reduced.

The recessed-drain Schottky electrode 17a illustrates that the recessed-drain Schottky electrode of the present invention may have various structures and shapes depending on the structure or characteristic of a heterojunction transistor. Another exemplary embodiment is described below with reference to FIGS. 7 to 10.

Figure 7:
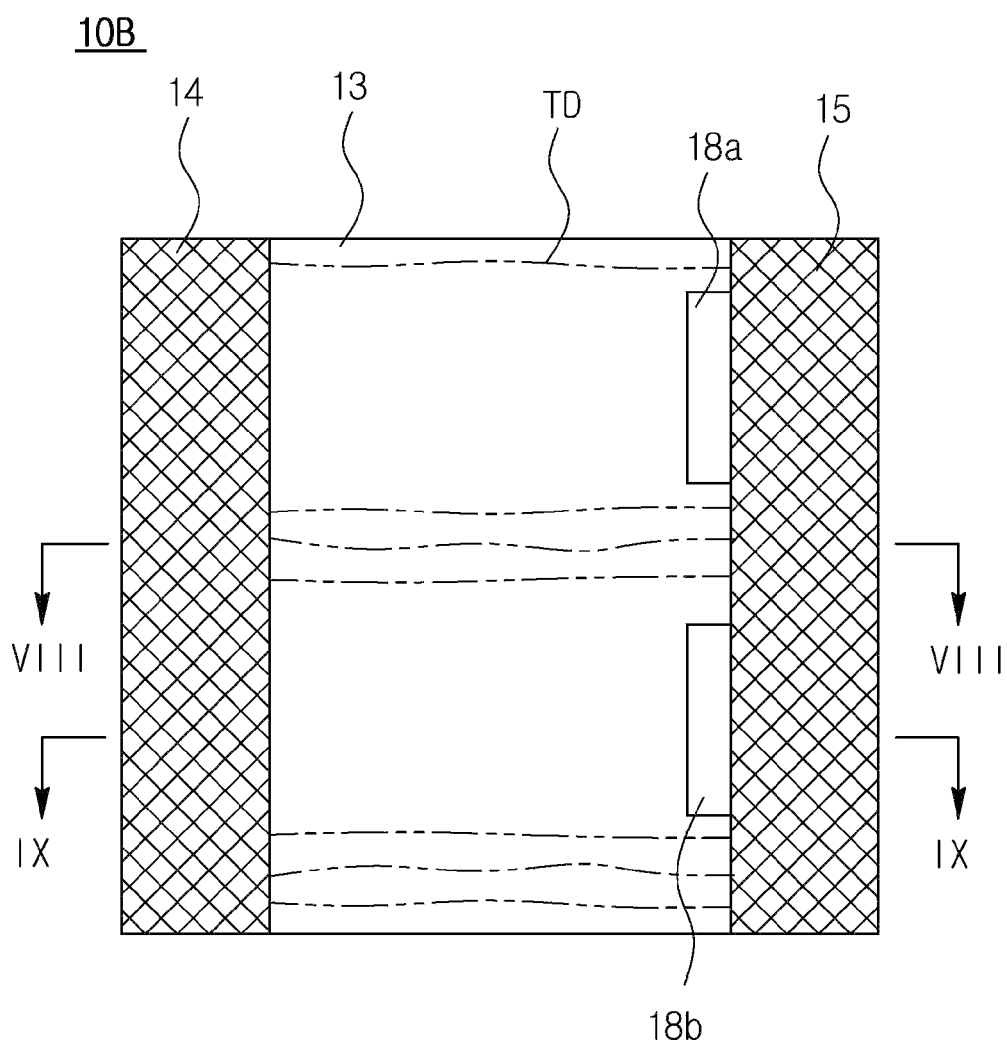
FIG. 7 is a plan view of a unidirectional heterojunction transistor in accordance with an exemplary embodiment of the present invention.
Figure 8:
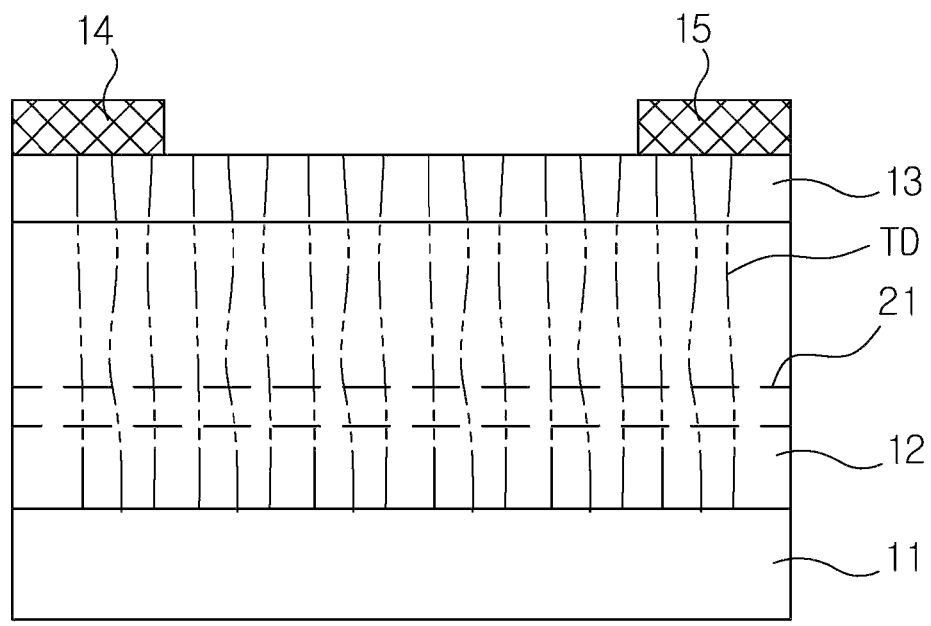
FIG. 8 is a cross-sectional view of the unidirectional heterojunction transistor taken along line VIII-VIII of FIG. 7.
Figure 9:
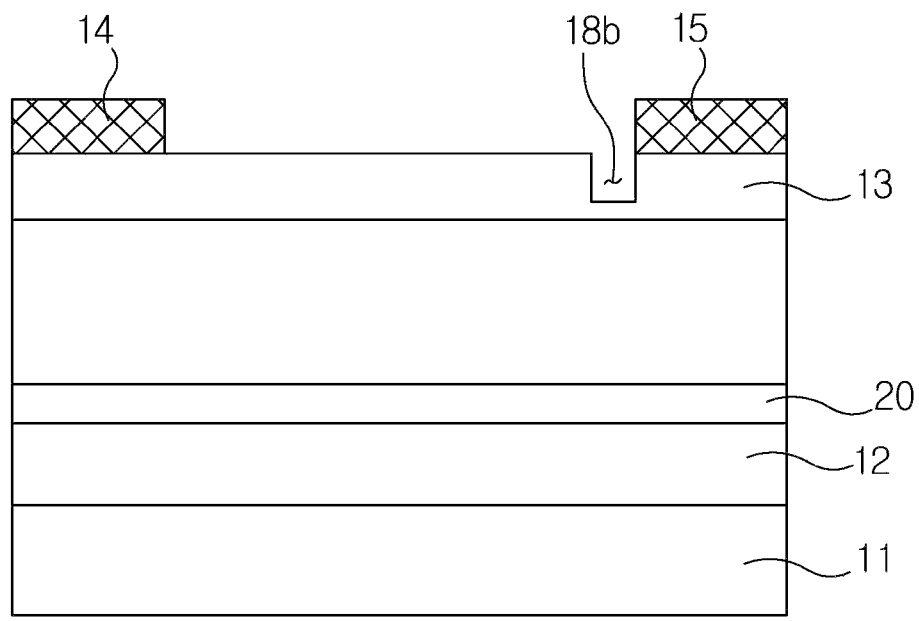
FIG. 9 is a cross-sectional view of the unidirectional heterojunction transistor taken along line IX-IX of FIG. 7.
Figure 10:
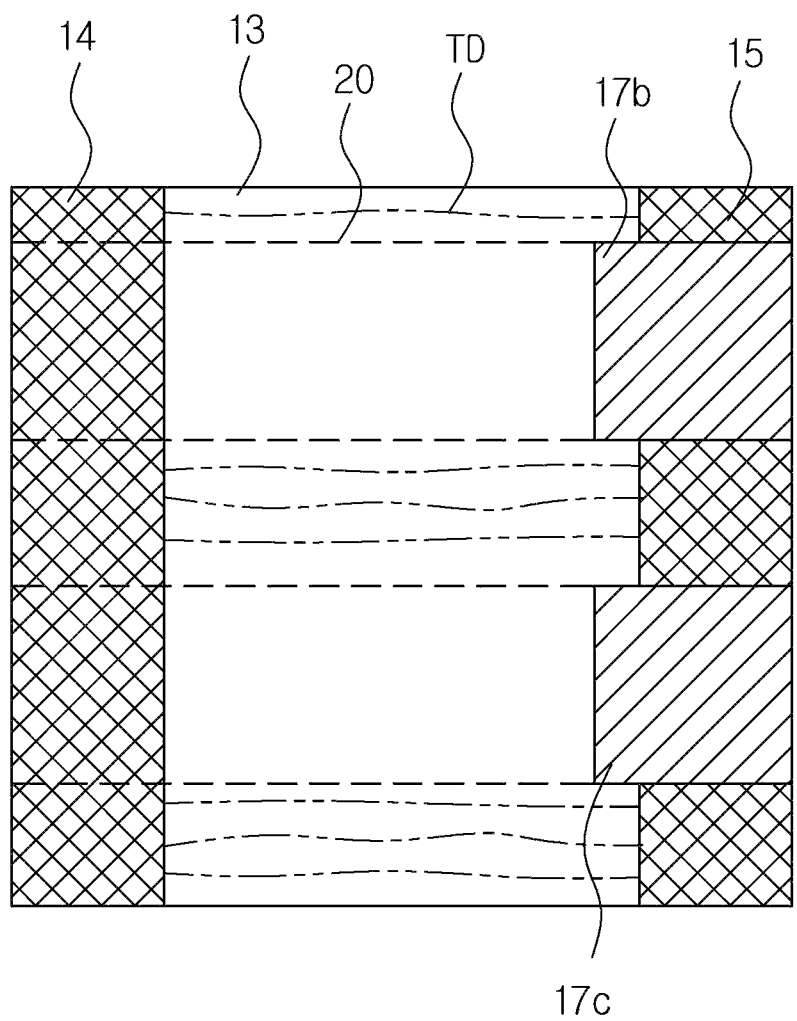
FIG. 10 is a plan view of a unidirectional heterojunction transistor in accordance with an exemplary embodiment of the present invention.

FIG. 7 is a plan view of a unidirectional heterojunction transistor in accordance with an exemplary embodiment of the present invention, FIG. 8 is a cross-sectional view of the unidirectional heterojunction transistor taken along line VIII-VIII of FIG. 7, FIG. 9 is a cross-sectional view of the unidirectional heterojunction transistor taken along line IX-IX of FIG. 7, and FIG. 10 is a plan view of a unidirectional heterojunction transistor in accordance with an exemplary embodiment of the present invention.

The plan view of FIG. 7 and the cross-sectional views of FIGS. 8 and 9 relate to an exemplary embodiment corresponding to the manufacturing process of FIG. 5C. Furthermore, the plan view of FIG. 10 relates to an exemplary embodiment corresponding to the manufacturing process of FIG. 5D.

As shown in FIG. 7, in a method of manufacturing the unidirectional heterojunction transistor 10B according to the present exemplary embodiment, after forming the source electrode 14 and the drain electrode 15 on the barrier layer 13, a recess region 18a for the recessed-drain Schottky electrode is formed. Here, if a semiconductor device has been grown so that a threading dislocation TD is concentrated on a specific region of the channel layer 12 and the barrier layer 13, the recess region 18a may be deposited in a low density dislocation region so that a current path between the drain electrode and the source electrode can avoid a high-density dislocation region on which the threading dislocation has been concentrated.

In the present exemplary embodiment, in order to grow the semiconductor layer of the heterojunction transistor so that the threading dislocation TD is concentrated on a specific region of the channel layer 12 and the barrier layer 13, a patterned insulating film 20 may be disposed in the middle of the channel layer 12, and the channel layer 12 may be regrown through the opening part 21 of the patterned insulating film 20 so that the threading dislocation TD is concentrated on the high-density dislocation region, as shown in FIGS. 8 and 9. A recess region may be divided into the recess regions 18a and 18b and formed in a plurality of trenches that extend in the direction in which the drain electrode 15 extends as shown in FIG. 7.

Furthermore, if the recess regions 18a and 18b formed in the plurality of trenches are used, recessed-drain Schottky electrodes 17b and 17b can be formed into a plurality of electrodes that are separated from each other along a current path formed between the drain electrode 15 and the source electrode 14 having a stripe form, as shown in FIG. 10.

The recessed-drain Schottky electrodes according to exemplary embodiments of the present invention may have a structure in which a plurality of end parts of the recessed-drain Schottky electrodes are inserted into the respective trenches of the recess regions 18a and 18b and body parts connected to the plurality of end parts are connected and brought in contact with one side of the drain electrode 15 or are brought in contact with one side and a top surface of the drain electrode 15 (refer to FIG. 4 or 3).

In the aforementioned exemplary embodiments, the unidirectional heterojunction transistor implemented as a normally-off characteristic device using the recessed-drain Schottky electrode has been illustrated, may also be applied to a semiconductor device implemented as a normally-off characteristic using P-GaN or P-AlGaN. That is, the unidirectional heterojunction transistor of the present invention may be implemented as a normally-off characteristic device by applying the recessed-drain Schottky electrode to a normally-on device or may be implemented as a semiconductor device of a new structure having an enhanced normally-off characteristic by applying the recessed-drain Schottky electrode to an existing semiconductor device having a normally-off characteristic.

Figure 11:
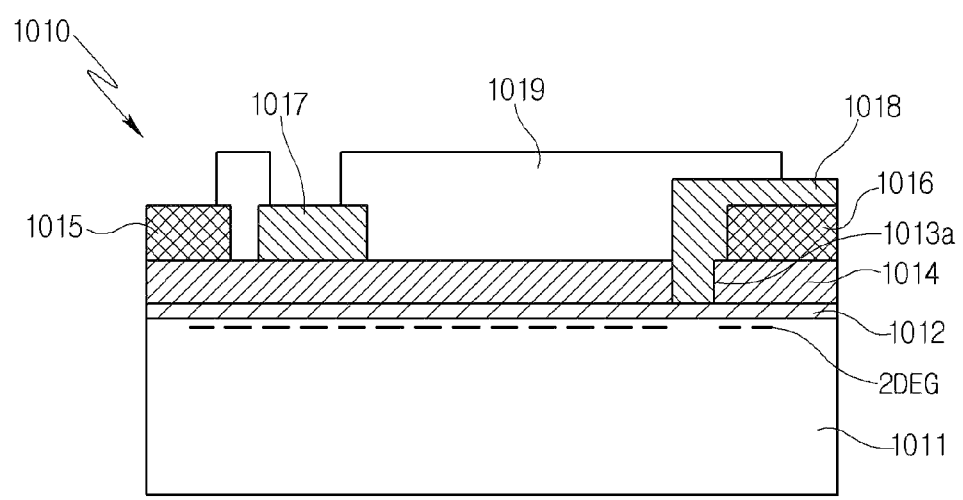
FIG. 11 is a cross-sectional view of a nitride semiconductor device according to an exemplary embodiment of the present invention.

FIG. 11 is a cross-sectional view of a nitride semiconductor device according to an exemplary embodiment of the present invention.

Referring to FIG. 11, the nitride semiconductor device 1010 includes a first nitride semiconductor layer 1011, a second nitride semiconductor layer 1012, a trench 1013a, a third nitride semiconductor layer 1014, a source electrode 1015, a drain electrode 1016, a gate electrode 1017, a Schottky electrode 1018, and a passivation layer 1019.

The elements of the nitride semiconductor device 1010 are described in detail below. The first nitride semiconductor layer 1011 may be formed of an undoped GaN semiconductor layer or p type GaN semiconductor layer having a first energy bandgap. The first nitride semiconductor layer 1011 functions as a channel layer in a GaN electron device (e.g., a transistor). In order to enhance the function of the channel layer, at least one n type GaN layer doped with additional materials, such as silicon (Si), may be additionally formed over or under the first nitride semiconductor layer 1011.

The second nitride semiconductor layer 1012 is formed on the first nitride semiconductor layer 1011 and functions as a barrier layer or electron supply layer for supplying electrons to the first nitride semiconductor layer 1011. The second nitride semiconductor layer 1012 has a second energy bandgap higher than the first energy bandgap. The second nitride semiconductor layer 1012 is made of materials which form a 2DEG channel near the boundary of the first nitride semiconductor layer 1011 through the heterojunction of the second nitride semiconductor layer 1012 and the first nitride semiconductor layer 1011. The second nitride semiconductor layer 1012 may be formed of an AlGaN semiconductor layer.

The third nitride semiconductor layer 1014 is formed on the second nitride semiconductor layer 1012 and functions as an electron supply layer for supplying electrons to the first nitride semiconductor layer 1011. The third nitride semiconductor layer 1014 has a third energy bandgap higher than the first energy bandgap. The third energy bandgap may be the same as the second energy bandgap.

The third nitride semiconductor layer 1014 is equipped with the trench 1013a. The trench 1013a functions to accommodate the recessed-drain Schottky electrode 1018 in the internal space of the trench. The trench 1013a penetrates the third nitride semiconductor layer 1014.

In the present exemplary embodiment, the third nitride semiconductor layer 1014 is regrown from the second nitride semiconductor layer 1012 through an insulating film mask disposed on the second nitride semiconductor layer 1012. Here, the regrowth refers to epitaxial regrowth.

The third nitride semiconductor layer 1014 regrown from the second nitride semiconductor layer 1012 may have the same materials and component composition as the second nitride semiconductor layer 1014. The third nitride semiconductor layer 1014 may be formed of an AlGaN semiconductor layer.

The third nitride semiconductor layer 1014 may be made of the same materials (e.g., AlGaN) as the second nitride semiconductor layer 1012, or may have a different component composition from the second nitride semiconductor layer 1012 by controlling an atmosphere of the regrowth process. The aluminum (Al) composition ratio of the third nitride semiconductor layer 1014 may be greater than that of the second nitride semiconductor layer 1012. In such a case, the thickness or Al composition ratio of the third nitride semiconductor layer 1014 may be selected randomly or designed depending on a set value of electron mobility according to the 2DEG channel in the state in which the composition and thickness of the second nitride semiconductor layer 1012 have been previously fixed.

The source electrode 1015 and the drain electrode 1016 are disposed on the third nitride semiconductor layer 1014 at a specific interval. The source electrode 1015 and the drain electrode 1016 are made of materials that come in low resistance ohmic contact with the third nitride semiconductor layer 1014. Titanium (Ti), aluminum (Al), gold (Au), nickel (Ni), platinum (Pt), or titanium carbide (TiC) may be used as materials for an ohmic contact.

The gate electrode 1017 is configured not to have a recess gate structure, and is disposed on the third nitride semiconductor layer 1014 between the source electrode 1015 and the drain electrode 1016. The gate electrode 1017 functions to control the electrification state of a channel, formed under the gate electrode 1017, in response to a bias (e.g., a positive voltage).

The gate electrode 1017 may be made of materials that have a higher work function than the heterojunction of the first nitride semiconductor layer 1011 and the second nitride semiconductor layer 1012. The gate electrode 1017 is made of materials that come in Schottky contact with the third nitride semiconductor layer 1014. The gate electrode 1017 may be made of mixed metal, such as Ni/Au.

The recessed-drain Schottky electrode 1018 is formed to extend into the internal space of the trench 1013a which is disposed between the gate electrode 1017 and the drain electrode 1016, brought in contact with the drain electrode 1016, and formed in the third nitride semiconductor layer 1014. The recessed-drain Schottky electrode 1018 is configured to come in contact with the second nitride semiconductor layer 1012 through the trench 1013a and to cover at least one side of the drain electrode 1016 or cover one side and a top surface of the drain electrode 1016.

The second nitride semiconductor layer 1012 under the trench 1013a may have a thickness of about 1 nm to about 5 nm. If the thickness of the second nitride semiconductor layer 1012 is less than about 1 nm, a channel may be depleted when the semiconductor device operates, and a the forward threshold voltage of a device (e.g., a transistor) may be high. If the thickness of the second nitride semiconductor layer 1012 exceeds about 5 nm, a depletion region may not be sufficiently formed in a Schottky barrier and thus a discontinuous region may not be properly formed in the 2DEG channel.

In the junction structure of the third nitride semiconductor layer 1014 and the recessed-drain Schottky electrode 1018, a Schottky barrier is formed due to a difference between the work functions of the materials that form the third nitride semiconductor layer 1014 and the recessed-drain Schottky electrode 1018. The formed Schottky barrier shows a rectification characteristic. The recessed and mixed junction drain refers to a combination of the drain electrode 1016 and the recessed-drain Schottky electrode 1018.

If the recessed and mixed junction drain is used, when a reverse voltage is applied to the semiconductor device, it may be difficult for an electric current to flow from the source electrode 1015 to the recessed-drain Schottky electrode 1018 and the drain electrode 1016 due to the Schottky barrier. When a forward voltage is applied to the semiconductor device, an electric current can flow into the source electrode 1015 because both the drain electrode 1016 and the recessed-drain Schottky electrode 1018 are used.

That is, the semiconductor device 1010 of the present exemplary embodiment having the recessed and mixed junction drain structure in which the recessed-drain Schottky electrode 1018 and the drain electrode 1016 are combined can show a low leakage current characteristic when a reverse voltage is applied along with a low forward threshold voltage in a unidirectional switching characteristic. Furthermore, the semiconductor device 1010 can prevent a reverse leakage current and improve efficiency due to a reduced switching loss using the recessed and mixed junction drain structure and can be used as a unidirectional heterojunction transistor useful in application products, such as a power switching element and a high-frequency element that require fast switching speed.

The passivation layer 1019 functions to protect the underlying semiconductor substrate. The passivation layer 1019 is disposed so that the source electrode 1015, the gate electrode 1017, and the recessed-drain Schottky electrode 1018 are exposed, but is disposed to cover the third nitride semiconductor layer 1014 exposed to the semiconductor substrate. The passivation layer 1019 may be made of materials, such as alumina ($Al_2O_3$), nitride aluminum (AlN), silicon oxide ($SiO_2$), or silicon nitride ($Si_xN_y$).

In accordance with the present exemplary embodiment, the thickness of the second nitride semiconductor layer 1012 at the bottom of the recessed-drain Schottky electrode 1018 can be stably controlled to a level of several nanometers with excellent reappearance using a regrowth scheme without using an etch process.

Furthermore, if only an existing Schottky-drain electrode is used, a rectification characteristic can be obtained, but there a threshold voltage may be increased in the forward electrification state of a heterojunction transistor due to a high Schottky barrier. Furthermore, a Schottky electrode combined with ohmic electrodes (i.e., a drain electrode and a source electrode) can reduce a threshold voltage in an on state, but shows a high leakage current through the ohmic electrodes close to the 2DEG channel. In the present invention, however, the recessed and mixed junction drain is formed by combining the recessed-drain Schottky electrode 1018 with the drain electrode 1016 having an ohmic characteristic, and the discontinuous region is stably formed in the 2DEG channel under the recessed-drain Schottky electrode 1018. Accordingly, a semiconductor device capable of mass production and having a normally-off characteristic can be implemented.

Figure 12:
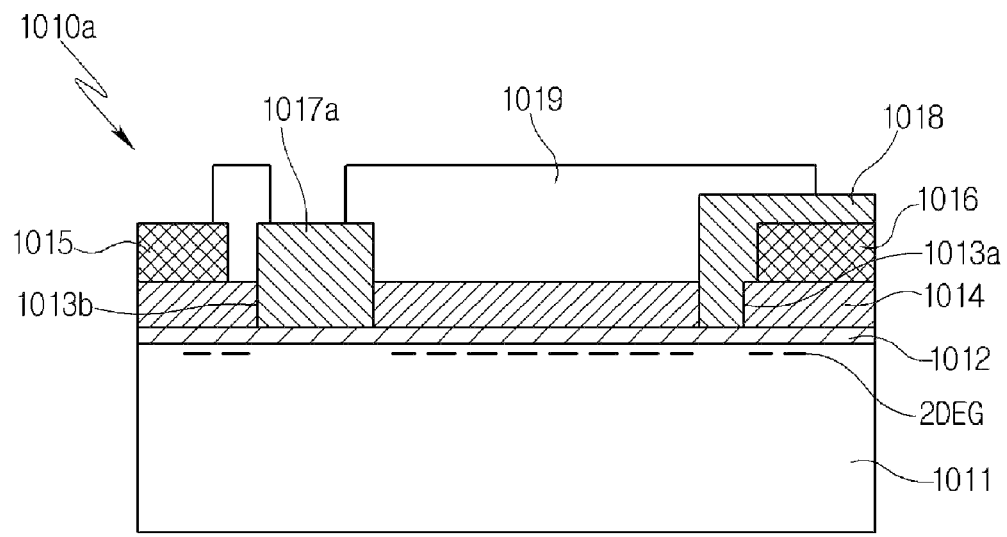
FIG. 12 is a cross-sectional view of a nitride semiconductor device in accordance with an exemplary embodiment of the present invention.
Figure 13:
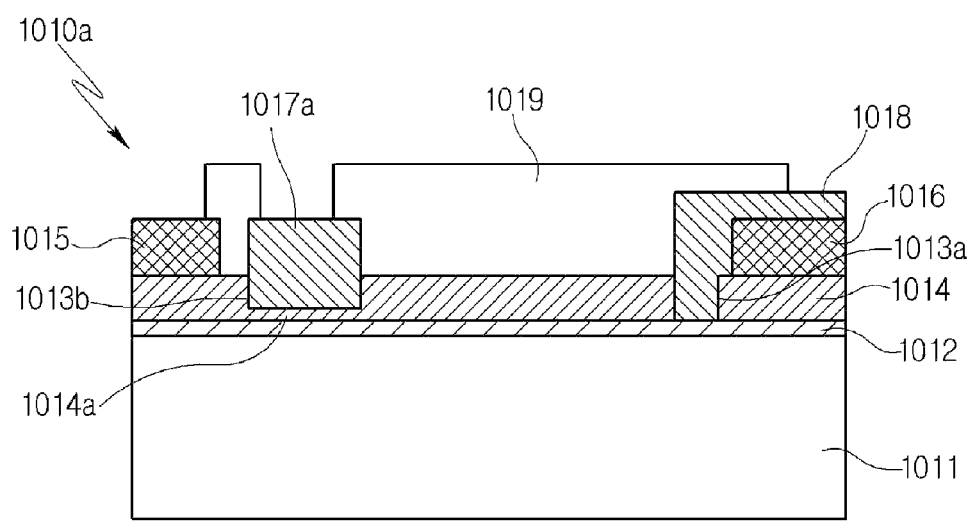
FIG. 13 is a cross-sectional view of the nitride semiconductor device according to FIG. 12.

FIG. 12 is a cross-sectional view of a nitride semiconductor device in accordance with an exemplary embodiment of the present invention, and FIG. 13 is a cross-sectional view of the nitride semiconductor device according to a modified example of FIG. 12.

Referring to FIG. 12, the nitride semiconductor device 1010a includes the first nitride semiconductor layer 1011, the second nitride semiconductor layer 1012, a first trench 1013a, a second trench 1013b, the third nitride semiconductor layer 1014, the source electrode 1015, the drain electrode 1016, a recess gate electrode 1017a, the recessed-drain Schottky electrode 1018, and the passivation layer 1019.

The nitride semiconductor device 1010a according to the present exemplary embodiment is substantially the same as the nitride semiconductor device 1010 described with reference to FIG. 11 except that the recess gate electrode 1017a is formed in the second trench 1013b. Accordingly, a detailed description of the same elements of the nitride semiconductor device 1010a is omitted in order to avoid redundancy.

The second trench 1013b is configured to penetrate the third nitride semiconductor layer 1014 in the gate region and is disposed to expose the second nitride semiconductor layer 1012. The second trench 1013b may be formed in an arc form or a reversed trapezoid form in addition to a rectangular form.

The recess gate electrode 1017a is for assigning a normally-off characteristic by forming a discontinuous region in a 2DEG channel that is formed at a heterojunction interface in the nitride semiconductor device that forms a heterojunction transistor.

In particular, in the semiconductor device 1010a of the present exemplary embodiment, the third nitride semiconductor layer 1014 including the first trench 1013a and the second trench 1013b is formed by regrowing the second nitride semiconductor layer 1012 grown from the first nitride semiconductor layer 1011. The first thickness (about 1 nm to about 5 nm) of the second nitride semiconductor layer 1012 under the first trench 1013a and the second thickness of the second nitride semiconductor layer 1012 under the second trench 1013b can be stably reproduced to a desired thickness. As a result, the mass production of a high mobility heterojunction semiconductor device having a unidirectional electrification characteristic and a normally-off characteristic due to a dual structure can be improved.

In accordance with the present exemplary embodiment, a normally-off characteristic is implemented by forming a discontinuous region in a 2DEG channel under the recess gate electrode 1017a.

In a conventional heterojunction transistor, in order to form a gate recess structure, part (corresponding to the third nitride semiconductor layer) of a barrier layer (corresponding to a combination of the second nitride semiconductor layer and the third nitride semiconductor layer) is etched. Here, if the thickness of the barrier layer under the recess gate electrode is thin, the discontinuous region is formed in the 2DEG channel in a turn-off state in which a bias has not been applied to the recess gate electrode because piezoelectric polarization is weakened by the barrier layer under the recess gate electrode.

In a method of manufacturing the conventional heterojunction transistor, however, in order to implement a normally-off characteristic, the barrier layer under the recess gate electrode needs to be removed so that only a thickness of several nanometers remains. In such a case, since the boundary of the heterojunction does not normally have a uniform thickness, it may be difficult to uniformly control the thickness of the barrier layer under the recess gate electrode in an etch process. Furthermore, electron mobility may be reduced by etch damage that is generated in the barrier layer in an etch process.

In the present exemplary embodiment, the second nitride semiconductor layer 1012 having a thickness of several nanometers and functioning as a channel layer is grown, and the third nitride semiconductor layer 1014 functioning as a barrier layer is regrown and formed on the second nitride semiconductor layer 1012. Accordingly, a nitride semiconductor device capable of solving the aforementioned conventional problems, mass production, and a normally-off characteristic with high reliability can be implemented.

The second thickness is not the same as the first thickness, and may be thicker than the first thickness. For example, as shown in FIG. 13, the third nitride semiconductor layer 1014 may be regrown in two steps. More particularly, a portion of the third nitride semiconductor layer 1014a disposed under the second trench 1013b may be primarily regrown to a specific thickness using a photo and etch process for a specific insulating film, a recess pattern layer may be formed at the position where the first trench 1013a and the second trench 1013b will be placed, and the third nitride semiconductor layer 1014 may be secondarily regrown using the recess pattern layer as a mask. In such a case, the recess gate electrode 1017a may be made of materials different from those of the recessed-drain Schottky electrode 1018. Here, the second thickness of the third nitride semiconductor layer under the recess gate electrode 1017a may be controlled to a proper thickness in order to implement a normally-off characteristic according to the recess gate electrode 1017a.

FIGS. 14A to 14D are process flowcharts illustrating a method of manufacturing the nitride semiconductor device shown in FIG. 12.

Figure 14A:
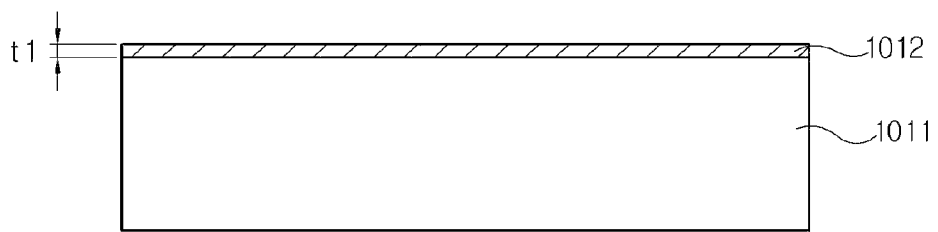
FIGS. 14A, 14B, 14C, and 14D are process flowcharts illustrating a method of manufacturing the nitride semiconductor device shown in FIG. 12.

As shown in FIG. 14A, the first nitride semiconductor layer 1011 having the first energy bandgap is formed on the substrate. The first nitride semiconductor layer 1011 may be grown on a sapphire substrate as an undoped GaN semiconductor layer having a several μm thickness using film growth equipment, such as Metal Organic Chemical Vapor Deposition (MOVCD) equipment. An n type GaN layer may be inserted into the undoped GaN semiconductor layer as a channel GaN layer having a thickness of several nm to several hundreds of nm.

A Si substrate, a SiC substrate, an AlN substrate, or a GaN substrate may also be used as the growth substrate on which the first nitride semiconductor layer 1011 is grown in addition to the sapphire substrate. The first nitride semiconductor layer 1011 may be grown from a GaN buffer layer having a thickness of several tens of nm after growing the GaN buffer layer having on the growth substrate.

Next, the second nitride semiconductor layer 1012 having the second energy bandgap higher than the first energy bandgap is grown on the first nitride semiconductor layer 1011. The second nitride semiconductor layer 1012 can be grown as an AlGaN semiconductor layer capable of supplying electrons to the first nitride semiconductor layer 1011.

In the present exemplary embodiment, the second nitride semiconductor layer 1012 is formed to a predetermined thickness in order to stably implement a normally-off characteristic according to the recessed-drain Schottky electrode 1018 to be described later. The thickness 't1' of the second nitride semiconductor layer 1012 may be about 1 nm to about 5 nm by taking a proper threshold voltage and a normally-off characteristic into consideration.

After the first nitride semiconductor layer 1011 and the second nitride semiconductor layer 1012 are grown to a predetermined thickness over a specific growth substrate through a continuous film growth process, the growth substrate may be removed using a method of removing the substrate, such as a laser lift-off method.

Figure 14B:
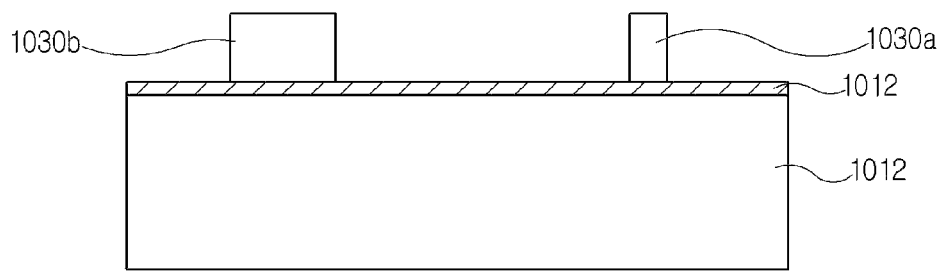

Next, as shown in FIG. 14B, an oxide layer or a nitride layer is formed on the second nitride semiconductor layer 1012. A first recess pattern layer 1030a and a second recess pattern layer 1030b are formed by patterning the oxide layer or the nitride layer using a photo and etching process.

Figure 14C:
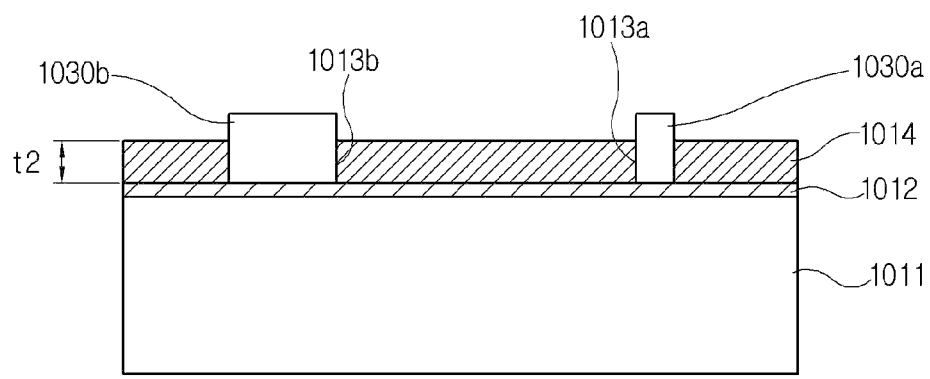

Next, as shown in FIG. 14C, the third nitride semiconductor layer 1014 including the first trench 1013a and the second trench 1013b is formed on the second nitride semiconductor layer 1012 by regrowing the second nitride semiconductor layer 1012 using the first recess pattern layer 1030a and the second recess pattern layer 1030b as a mask.

The third nitride semiconductor layer 1014 may be grown as an AlGaN semiconductor layer capable of supplying electrons to the first nitride semiconductor layer 1011. Another semiconductor layer made of AlN or InAlGaN may be additionally grown between the AlGaN semiconductor layers or on a top or bottom surface of the AlGaN semiconductor layer.

Furthermore, the third nitride semiconductor layer 1014 is regrown using the first recess pattern layer 1030a and the second recess pattern layer 1030b that cover the second nitride semiconductor layer 1012 in a specific pattern form as a mask. Accordingly, the first trench 1013a and the second trench 1013b are formed to penetrate the third nitride semiconductor layer 1014.

The thickness 't2' of the third nitride semiconductor layer 1014 is a thickness at which a stable AlGaN/GaN heterojunction structure can be formed. That is, if the thickness of the second nitride semiconductor layer 1012 is too thin, a 2DEG channel may not be properly formed at the interface of the first nitride semiconductor layer 1011 and the second nitride semiconductor layer 1012 through the heterojunction of the first nitride semiconductor layer 1011 and the second nitride semiconductor layer 1012. Accordingly, the thickness 't2' of the third nitride semiconductor layer 1014 may be a size capable of stably forming the 2DEG channel through the AlGaN/GaN heterojunction structure.

The thickness 't2' of the third nitride semiconductor layer 1014 may be properly controlled depending on a composition (e.g., an Al composition ratio) of the third nitride semiconductor layer 1014. The Al composition ratio of the third nitride semiconductor layer 1014 may be about 5% to about 25% by taking easy process control and the thickness stress of the semiconductor layer into consideration.

If the AlGaN/GaN heterojunction structure is used, the 2DEG channel occurring due to the discontinuity of a conduction band between the two materials can be used. Accordingly, high electron mobility, a high breakdown voltage, and a high output characteristic can be obtained in a semiconductor device, such as a heterojunction transistor.

Figure 14D:
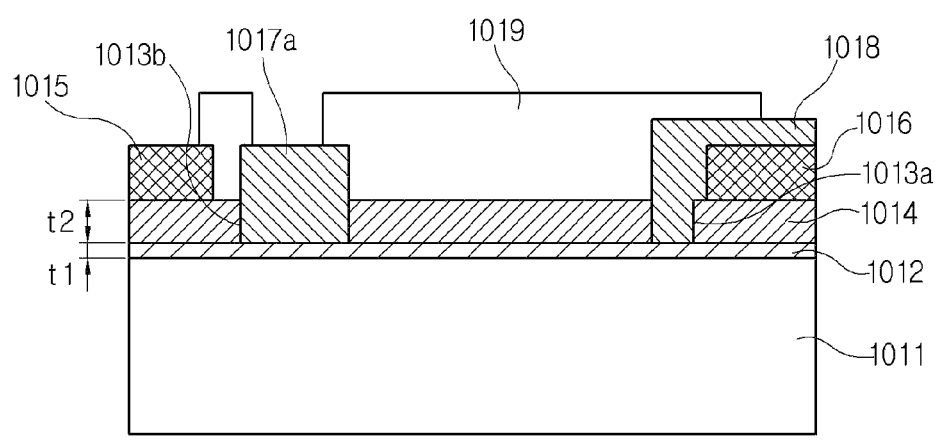

Next, as shown in FIG. 14D, the source electrode 1015 and the drain electrode 1016 are formed on the third nitride semiconductor layer 1014. The source electrode 1015 and the drain electrode 1016 may be formed in a source region and a drain region, respectively, through a photo and etch process for a photoresist that is coated on the third nitride semiconductor layer 1014, the first recess pattern layer 1030*a*, and the second recess pattern layer 1030*b*.

The recess gate electrode 1017*a* may be spaced apart from the source electrode 1015 at an interval of several nm or less (e.g., 5 μm). The interval between the recess gate electrode 1017*a* and the source electrode 1015 may be reduced to a maximum extent within a range not affected by a gate-source breakdown voltage.

The source electrode 1015 and the drain electrode 1016 are made of materials that come in ohmic contact with the third nitride semiconductor layer 1014. For example, Ti, Al, Pd, Au, or W a combination thereof may be used as the electrode materials.

Next, the recess gate electrode 1017*a* is formed on the second trench 1013*b*, and the recessed-drain Schottky electrode 1018 is formed in the first trench 1013*a*.

The recess gate electrode 1017*a* and the recessed-drain Schottky electrode 1018 may be formed by removing the photoresist, the first recess pattern layer 1030*a*, and the second recess pattern layer 1030*b* left over in the previous process, coating a photoresist on the semiconductor substrate again, exposing the first trench 1013*a* and the second trench 1013*b* to the semiconductor substrate through a photo and etch process for the photoresist, and then depositing Schottky contact materials.

The recess gate electrode 1017*a* and the recessed-drain Schottky electrode 1018 may be made of materials that come in Schottky contact with the third nitride semiconductor layer 1014. Single metal, such as Ni, Au, Al, or Ti, or combined and mixed metal of Ni, Au, Al, and Ti may be used as the electrode materials for Schottky contact. Ni/Au or Al/Ti may be used as the mixed metal. Furthermore, metal materials, such as Pt, Mo, or Ir, may be added to the electrode materials for Schottky contact. Here, Pt may function to enable a high breakdown voltage and a low gate leakage current owing to its high metal work function, and Mo may function to enable a stable operation at a high temperature owing to its high melting point.

Next, the passivation layer 1019 is formed to cover the third nitride semiconductor layer 1014, but to expose the source electrode 1015, the drain electrode 1016, and the recess gate electrode 1017*a*. The passivation layer 1019 functions to protect the underlying semiconductor substrate and may be made of alumina, nitride aluminum, silicon oxide, or silicon nitride.

The aforementioned nitride semiconductor layer or electrode layer may be formed using film formation equipment, such as MBE equipment or HVPE equipment, in addition to MOCVD equipment.

In accordance with the present exemplary embodiment, a GaN electron device having a normally-off characteristic can be fabricated in a mass production manner. Furthermore, a unidirectional electrification GaN electron device equipped with a dual normally-off characteristic structure having a high breakdown voltage and a low on-resistance and high on-current density characteristic can be fabricated in a mass production manner.

Figure 15:
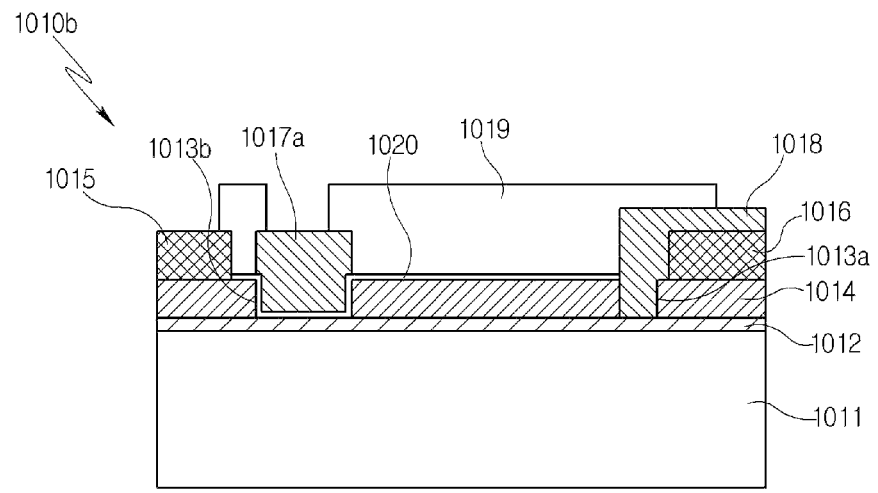
FIG. 15 is a cross-sectional view of a nitride semiconductor device in accordance with an exemplary embodiment of the present invention.

FIG. 15 is a cross-sectional view of a nitride semiconductor device in accordance with an exemplary embodiment of the present invention.

Referring to FIG. 15, the nitride semiconductor device 1010*b* includes the first nitride semiconductor layer 1011, the second nitride semiconductor layer 1012, the first trench 1013*a*, the second trench 1013*b*, the third nitride semiconductor layer 1014, the source electrode 1015, the drain electrode 1016, the recess gate electrode 1017*a*, the recessed-drain Schottky electrode 1018, the passivation layer 1019, and an insulating masking layer 1020.

The semiconductor device 1010*b* according to the present exemplary embodiment is substantially the same as the semiconductor device 1010*a* described with reference to FIG. 12 other than the insulating masking layer 1020, and thus a detailed description of the same elements is omitted in order to avoid redundancy.

The insulating masking layer 1020 is formed to cover the third nitride semiconductor 1014 exposed between the source electrode 1015 and the recessed-drain Schottky electrode 1018, the second trench 1013*b*, and the second nitride semiconductor layer 1012 exposed by the second trench 1013*b*. The insulating masking layer 1020 prevents the deterioration of reliability of the semiconductor device by blocking the leakage of the recess gate electrode 1017*a*.

The insulating masking layer 1020 may be formed to a proper thickness depending on a specific threshold voltage of the semiconductor device 1010*b* and the type of materials of the insulating masking layer 1020. For example, the insulating masking layer 1020 may be formed by forming the source electrode 1015 and the drain electrode 1016, forming the recessed-drain Schottky electrode 1018 on the first trench 1013*a* and the drain electrode 1016, and coating or depositing insulating materials on a semiconductor substrate on which a mask, such as a photoresist, is disposed.

The insulating masking layer 1020 may be formed of an oxide layer including silicon oxide ($SiO_2$) or a nitride layer including silicon nitride ($SiN_x$) or may be made of materials having a higher k value than silicon oxide or $Si_3N_4$ or $HfO_2$.

In accordance with the present exemplary embodiment, as a method of regrowing the patterned third nitride semiconductor layer 1014 from the second nitride semiconductor layer 1012 on the lower side near the ohmic contact drain electrode 1016, the first trench 1013*a* and the second trench 1013*b* are formed, the recessed-drain Schottky electrode 1018 is disposed in the internal space of the first trench 1013*a* in which the insulating masking layer 1020 is thinly formed, and the recess gate electrode 1017*a* is formed in the internal space of the second trench 1013*b*. Accordingly, the nitride semiconductor device having a normally-off characteristic can be implemented in a mass production manner and the threshold voltages of the semiconductor devices 1010*b* or 10*a* and 10 can be lowered up to about 0 V (e.g., about 0.4 V or less), much lower than the threshold voltage (about 1.2 V to 1.4 V) of an existing heterojunction transistor that uses a Schottky contact drain electrode under a forward bias condition because a discontinuous region is formed in a 2DEG induction channel under the first recess 1013*a*. Furthermore, the gate leakage of the nitride semiconductor device having a normally-off characteristic can be prevented and a leakage current from the source electrode 1015 to the drain electrode 1016 can be blocked, thereby being capable of improving device capabilities. Here, the leakage current refers to an electric current that flows through the drain electrode that comes in ohmic contact with a barrier layer (i.e., the third nitride semiconductor layer) when a reverse voltage is applied between the source electrode and the drain electrode in an existing heterojunction transistor.

Figure 16:
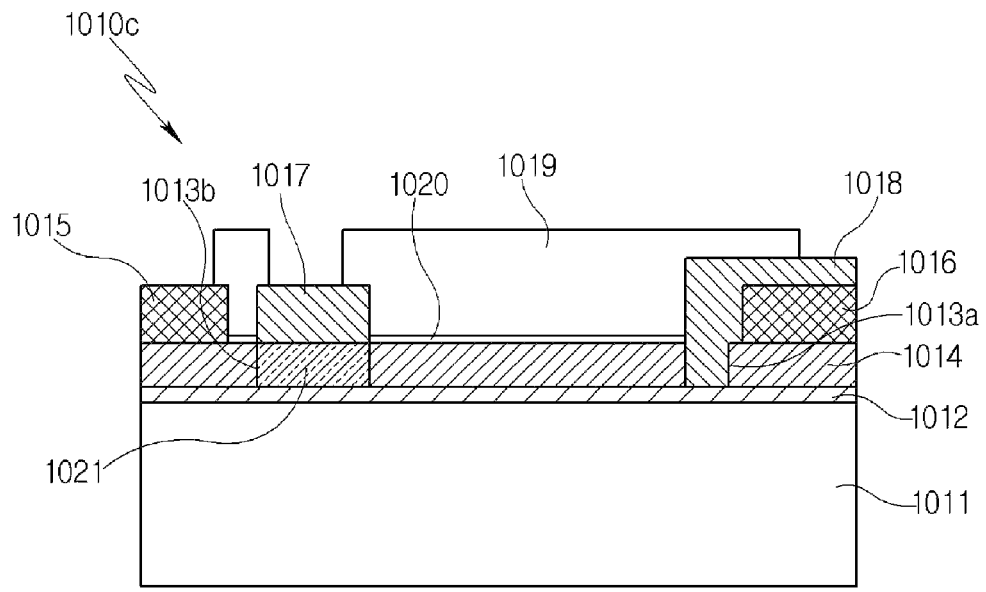
FIG. 16 is a cross-sectional view of a nitride semiconductor device in accordance with an exemplary embodiment of the present invention.

FIG. 16 is a cross-sectional view of a nitride semiconductor device in accordance with an exemplary embodiment of the present invention.

Referring to FIG. 16, the nitride semiconductor device 1010*c* includes the first nitride semiconductor layer 1011, the second nitride semiconductor layer 1012, the first trench 1013*a*, the second trench 1013*b*, the third nitride semiconductor layer 1014, the source electrode 1015, the drain electrode 1016, the recess gate electrode 1017a, the recessed-drain Schottky electrode 1018, the passivation layer 1019, the insulating masking layer 1020, and a P type semiconductor gate 1021.

The semiconductor device 1010c according to the present exemplary embodiment is substantially the same as the semiconductor device 1010 described with reference to FIG. 12 other than the P type semiconductor gate 1021 formed under the gate electrode 1017, and thus a detailed description of the same elements is omitted in order to avoid redundancy.

The P type semiconductor gate 1021 is disposed in a gate region between the source electrode 1015 and the drain electrode 1016. The P type semiconductor gate 1021 functions to rearrange a Fermi level that is formed by the heterojunction of the first nitride semiconductor layer 1011 and the second nitride semiconductor layer 1012.

In accordance with the action of the P type semiconductor gate 1021, a potential well of a valence band that is present near the interface of the first nitride semiconductor layer 1011 functioning as a channel layer and the second nitride semiconductor layer 1012 functioning as a barrier layer is moved over a Fermi level and placed therein. Accordingly, a discontinuous region in which 2DEG is not formed can be formed in a 2DEG channel.

The P type semiconductor gate 1021 is epitaxially grown on the second nitride semiconductor layer 1012 and may be formed of a nitride semiconductor layer doped with a dopant, such as B, As, P, or Mg or a combination thereof.

The P type semiconductor gate 1021 may be made of a GaN or AlGaN semiconductor or i-AlGaN semiconductor having a hole concentration of $5 \times 10^{16}/cm^3$ to $5 \times 10^{18}/cm^3$ through the implantation of impurities. The P type semiconductor gate 1021 may be made of a binary system nitride-based semiconductor, such as undoped GaN or InN, a ternary system nitride-based semiconductor, such as InGaN, or a quaternary system nitride-based semiconductor, such as AlInGaN.

When doping magnesium (Mg) having a high concentration in forming the P type semiconductor gate 1021, the P type semiconductor gate 1021 may have a maximum thickness of about 100 nm. The P type semiconductor gate 1021 may be made of $Al_{0.25}Ga_{0.75}N$. In such a case, the P type semiconductor gate 1021 may have a thickness of less than about 10 nm. If the composition of the P type semiconductor gate 1021 exceeds the aforementioned ranges, the nitride semiconductor device 1010c may have a normally-on characteristic instead of a normally-off characteristic.

In the nitride semiconductor device 1010c according to the present exemplary embodiment, the recess gate electrode and the recessed-drain Schottky electrode are formed without using an etch process. Accordingly, problems inherent in an existing gate recess structure using an etch process can be solved, a discontinuous region in which 2DEG may not be formed in a 2DEG channel can be stably controlled through the recessed-drain Schottky electrode and the P type semiconductor gate, and thus the nitride semiconductor device 1010c can have a normally-off characteristic having high reliability and excellent mass production.

Figure 17:
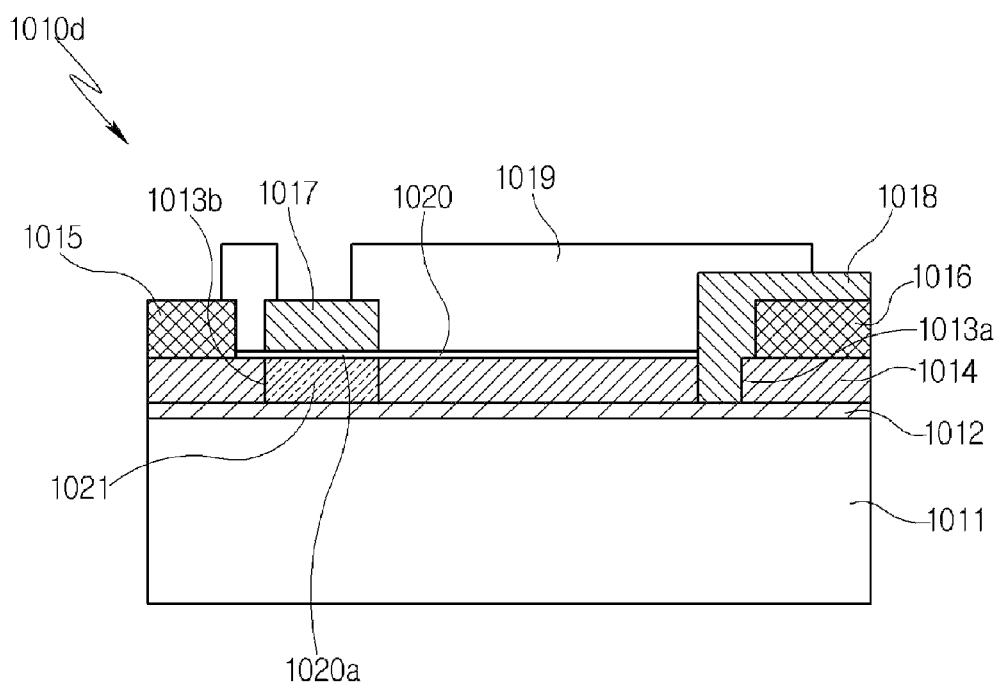
FIG. 17 is a cross-sectional view of a nitride semiconductor device in accordance with an exemplary embodiment of the present invention.

FIG. 17 is a cross-sectional view of a nitride semiconductor device in accordance with an exemplary embodiment of the present invention.

Referring to FIG. 17, the nitride semiconductor device 1010d is a nitride electron device having a Metal Insulator Semiconductor (MIS)-Heterojunction Field Effect Transistor (HFET) structure. The nitride semiconductor device 1010d includes the first nitride semiconductor layer 1011, the second nitride semiconductor layer 1012, the first trench 1013a, the second trench 1013b, the third nitride semiconductor layer 1014, the source electrode 1015, the drain electrode 1016, the recess gate electrode 1017a, the recessed-drain Schottky electrode 1018, the passivation layer 1019, the insulating masking layer 1020, and the p type GaN gate 1021.

In the nitride semiconductor device 1010d, the third nitride semiconductor layer 1014 is regrown on the second nitride semiconductor layer 1012 using the P type semiconductor gate 1021 and the first recess pattern layer under the gate electrode 1017a as a mask so that the P type semiconductor gate 1021 is formed in a gate control region and the recessed-drain Schottky electrode 1018 is formed in a drain region without an etch process.

The nitride semiconductor device 1010d according to the present exemplary embodiment is substantially the same as the semiconductor device 1010c described with reference to FIG. 16 other that an insulating masking layer 1020 including a gate insulating film 1020a, and thus a detailed description of the same or similar elements is omitted in order to avoid redundancy.

The insulating masking layer 1020 may be implemented by controlling subsequent processes so that an insulating film placed on the P type semiconductor gate 1021 and the third nitride semiconductor layer 1014 is not removed when forming the source electrode 1015 and the drain electrode 1016 in the nitride semiconductor device fabricated using the method of manufacturing described with reference to FIGS. 14A to 14D.

In accordance with the present exemplary embodiment, the nitride semiconductor device 1010d can have a high threshold voltage characteristic and a low gate leakage characteristic due to the gate insulating film 1020a placed between the gate electrode 1017 and the first nitride semiconductor layer 1011 and simplify a manufacturing process because a process of removing the insulating masking layer is omitted.

Furthermore, in accordance with the present exemplary embodiment, the second nitride semiconductor layer 1012 subject to a heterojunction with the first nitride semiconductor layer 1011, that is, a channel layer, is thinly formed, and the third nitride semiconductor layer 1014 is regrown on the second nitride semiconductor layer 1012 using the P type semiconductor gate 1021 or the recess pattern layer formed to have a specific pattern on the second nitride semiconductor layer 1012 as a mask. Accordingly, problems occurring in an etch process can be prevented, and the nitride semiconductor device that implements an excellent normally-off characteristic and also has excellent mass production can be provided.

As described above, the nitride semiconductor, that is, the unidirectional heterojunction transistor according to the present invention, and the method of manufacturing the same adopts the recessed-drain Schottky electrode structure in which the Schottky electrode and the ohmic contact drain electrode are combined. Accordingly, a leakage current in the reverse direction can be minimized and a low threshold voltage in the forward direction can be obtained by controlling the Schottky barrier and the 2DEG region.

The nitride semiconductor device, that is, the unidirectional heterojunction transistor in accordance with an exemplary embodiment of the present invention, and the method of manufacturing can reduce the switching loss of a transistor by a forward low threshold voltage characteristic and a low reverse leakage current characteristic and thus power efficiency of a circuit in application fields, such as a power conversion circuit and a high-frequency power amplification circuit necessary for a unidirectional switching element, can be improved.

The method of manufacturing a nitride semiconductor device according to the present invention discloses a nitride semiconductor device capable of stably blocking a reverse current between the source electrode and the drain electrode that can be fabricated in a mass production manner because the mixed junction drain is formed using the regrowth method.

Furthermore, the method of manufacturing a nitride semiconductor device in accordance with an exemplary embodiment of the present invention discloses a nitride semiconductor device capable of stably blocking a reverse current between the source electrode and the drain electrode and having a normally-off characteristic that can be fabricated at low cost and with a high yield because the recessed and mixed junction drain is formed using the regrowth method.

Furthermore, the nitride semiconductor device in accordance with an exemplary embodiment of the present invention discloses a stable normally-off characteristic and a reverse current blocking characteristic as an electron device that is relatively cheap and has high performance because it includes the recessed and mixed junction drain formed using the regrowth method.

Although examples in which the semiconductor devices are field effect transistors have been described in connection with the exemplary embodiments, the present invention is not limited to the aforementioned structures and may be implemented as an electron device, an optoelectronic device, and an electromechanical device using the semiconductor device according to the exemplary embodiments.

While the present invention has been described with respect to the specific exemplary embodiments, it will be apparent to those skilled in the art that various changes and modifications may be made without departing from the spirit and scope of the invention as defined in the following claims.

What is claimed is:

1. A nitride semiconductor device, comprising:
   a channel layer comprising a first nitride-based semiconductor having a first energy bandgap;
   a barrier layer comprising a second nitride-based semiconductor having a second energy bandgap different from the first energy bandgap, the barrier layer comprising a recess;
   a drain electrode disposed on a first region of the barrier layer; and
   a recessed-drain Schottky electrode disposed in the recess of the barrier layer, the recessed-drain Schottky electrode contacting the drain electrode.

2. The nitride semiconductor device of claim 1, further comprising:
   a source electrode disposed on a second region of the barrier layer; and
   a gate electrode disposed between the source electrode and the recessed-drain Schottky electrode on the barrier layer.

3. The nitride semiconductor device of claim 2, wherein the recessed-drain Schottky electrode is configured to block Two-dimensional Electron Gas (2DEG) formed at an interface of the channel layer and the barrier layer from flowing from the source electrode to the drain electrode.

4. The nitride semiconductor device of claim 2, wherein the recessed-drain Schottky electrode is configured to permit a unidirectional current flow from the drain electrode to the source electrode and form a Schottky potential barrier for blocking an electric current from flowing from the source electrode to the drain electrode between the source electrode and the drain electrode.

5. The nitride semiconductor device of claim 1, wherein the recessed-drain Schottky electrode comprises an end part disposed in a recess region of a trench that extends in an extending direction of the drain electrode.

6. The nitride semiconductor device of claim 5, wherein the end part of the recessed-drain Schottky electrode comprises a plurality of portions disposed along the extending direction of the drain electrode.

7. The nitride semiconductor device of claim 1, wherein the barrier layer comprises a material configured to form a Two-dimensional Electron Gas (2DEG) induction channel at the interface of the barrier layer and the channel layer, the barrier layer material selected from the group consisting of undoped GaN, undoped InN, AlGaN, InGaN, and AlInGaN.

8. A method of manufacturing a nitride semiconductor device, the method comprising:
   forming a channel layer comprising a first nitride-based semiconductor having a first energy bandgap;
   forming a barrier layer on the channel layer, the barrier layer comprising a second nitride-based semiconductor having a second energy bandgap different from the first energy bandgap;
   forming a source electrode and a drain electrode on the barrier layer;
   forming a recess region adjacent to the drain electrode, the recess region formed in the barrier layer; and
   forming a recessed-drain Schottky electrode in the recess region.

9. The method of claim 8, further comprising forming a gate electrode on the barrier layer.

10. The method of claim 8, wherein the barrier layer comprises a material configured to form a Two-dimensional Electron Gas (2DEG) induction channel at an interface of the barrier layer and the channel layer, the barrier layer selected from the group consisting of undoped GaN, undoped InN, AlGaN, InGaN, and AlInGaN.

11. A method of manufacturing a nitride semiconductor device, the method comprising:
   forming a first nitride semiconductor layer having a first energy bandgap;
   forming a second nitride semiconductor layer on the first nitride semiconductor layer, the second nitride semiconductor layer having a second energy bandgap;
   forming an insulating film on the second nitride semiconductor layer, the insulating film comprising a first recess pattern for forming a first trench;
   forming a third nitride semiconductor layer on the second nitride semiconductor layer, the third nitride semiconductor layer comprising the first trench, and the third nitride semiconductor layer comprising a thickness equal to or less than a thickness of the insulating film;
   forming a source electrode and a drain electrode on the third nitride semiconductor layer;
   removing the insulating film; and
   forming a gate electrode in a gate region on the second nitride semiconductor layer and forming a recessed-drain Schottky electrode on the second nitride semiconductor layer, wherein the recessed-drain Schottky electrode contacts the drain electrode and the second nitride semiconductor layer exposed at a bottom of the first trench.

12. The method of claim 11, wherein:
   the second nitride semiconductor layer is formed to a thickness of about 1 nm to about 5 nm, in which a Two-Dimensional Electron Gas (2DEG) channel is not configured to be formed by the junction of the first nitride semiconductor layer and the second nitride semiconductor layer in a state in which a bias has not been applied to the gate electrode; and the second and third nitride semiconductor layers are formed to a thickness in which the 2DEG channel is configured to be formed by the junction of the first nitride semiconductor layer and the second nitride semiconductor layer in a state in which a bias has not been applied to the gate electrode.

13. The method of claim 12, wherein:
the second energy bandgap is greater than the first energy bandgap; and
the third energy bandgap is greater than the first energy bandgap.

14. The method of claim 13, wherein:
the third nitride semiconductor layer is thicker than the second nitride semiconductor layer; and
the third nitride semiconductor layer has a third energy bandgap equal to the second energy bandgap.

15. The method of claim 13, wherein the third nitride semiconductor layer has a third energy bandgap greater than the second energy bandgap.

16. The method of claim 11, wherein the insulating film further comprises a second recess pattern for forming a second trench, the third nitride semiconductor layer further comprising the second trench.

17. The method of claim 16, further comprising forming a P type semiconductor gate in the second trench by epitaxially growing the second nitride semiconductor layer before forming the third nitride semiconductor layer.

18. A nitride semiconductor device, comprising:
a first nitride semiconductor layer having a first energy bandgap;
a second nitride semiconductor layer disposed on the first nitride semiconductor layer, the second nitride semiconductor layer having a second energy bandgap different from the first energy bandgap;
a third nitride semiconductor layer disposed on the second nitride semiconductor layer, the third nitride semiconductor layer comprising a first trench;
a source electrode and a drain electrode disposed on the third nitride semiconductor layer;
a gate electrode disposed on the second nitride semiconductor layer and between the source electrode and the gate electrode; and
a recessed-drain Schottky electrode contacting the drain electrode and the second nitride semiconductor layer exposed at the bottom of the first trench.

19. The nitride semiconductor device according to claim 18, wherein:
the second nitride semiconductor layer comprises a thickness of about 1 nm to about 5 nm, at which a Two-Dimensional Electron Gas (2DEG) channel is not configured to be formed by the junction of the first nitride semiconductor layer and the second nitride semiconductor layer in a state in which a bias has not been applied to the gate electrode; and
the second and third nitride semiconductor layers comprise a thickness, at which the 2DEG channel is configured to be formed by the junction of the first nitride semiconductor layer and the second nitride semiconductor layer in a state in which a bias has not been applied to the gate electrode.

20. The nitride semiconductor device according to claim 19, wherein:
the second energy bandgap is greater than the first energy bandgap; and
the third energy bandgap is greater than the first energy bandgap.

21. The nitride semiconductor device of claim 20, wherein:
the third energy bandgap is equal to the second energy bandgap; and
the third nitride semiconductor layer is thicker than the second nitride semiconductor layer.

22. The nitride semiconductor device of claim 20, wherein the third energy bandgap is greater than the second energy bandgap.

23. The nitride semiconductor device of claim 18, wherein the gate electrode comprises a recess gate electrode disposed in a second trench in the third nitride semiconductor layer.

24. The nitride semiconductor device of claim 23, wherein the recess gate electrode comprises:
a P type semiconductor gate disposed in the second trench and contacting the second nitride semiconductor layer; and
a gate electrode disposed on the P type semiconductor gate.

* * * * *